United States Patent
Takenaka

(10) Patent No.: US 9,171,965 B2
(45) Date of Patent: Oct. 27, 2015

(54) FORCE DETECTION DEVICE, AND FORCE TRANSDUCER DEVICE

(71) Applicant: YOKOGAWA ELECTRIC CORPORATION, Musashino-shi, Tokyo (JP)

(72) Inventor: Kazuma Takenaka, Musashino (JP)

(73) Assignee: YOKOGAWA ELECTRIC CORPORATION, Tokyo (JP)

(*) Notice: Subject to any disclaimer, the term of this patent is extended or adjusted under 35 U.S.C. 154(b) by 0 days.

(21) Appl. No.: 14/220,093

(22) Filed: Mar. 19, 2014

(65) Prior Publication Data

US 2014/0319538 A1    Oct. 30, 2014

(30) Foreign Application Priority Data

Apr. 24, 2013 (JP) ................. 2013-090884

(51) Int. Cl.
| | |
|---|---|
| H01L 29/84 | (2006.01) |
| G01L 5/16 | (2006.01) |
| G01L 9/00 | (2006.01) |
| G01L 9/06 | (2006.01) |
| G01L 1/16 | (2006.01) |
| G01L 1/18 | (2006.01) |
| H01L 29/16 | (2006.01) |

(52) U.S. Cl.
CPC . *H01L 29/84* (2013.01); *G01L 1/16* (2013.01); *G01L 1/18* (2013.01); *G01L 5/162* (2013.01); *G01L 5/167* (2013.01); *G01L 9/008* (2013.01); *G01L 9/0052* (2013.01); *G01L 9/06* (2013.01); *H01L 29/1602* (2013.01)

(58) Field of Classification Search
CPC .. H01L 29/1608; H01L 29/84; H01L 29/1602
USPC ................... 257/77, 198, E21.005, E21.095; 438/105, 931
See application file for complete search history.

(56) References Cited

U.S. PATENT DOCUMENTS

| | | | |
|---|---|---|---|
| 4,768,011 A | 8/1988 | Hattori et al. | |
| 5,303,594 A | 4/1994 | Kurtz et al. | |
| 5,349,873 A | 9/1994 | Omura et al. | |
| 5,488,350 A * | 1/1996 | Aslam et al. | 338/225 D |
| 6,082,200 A * | 7/2000 | Aslam et al. | 73/774 |
| 2012/0241822 A1 | 9/2012 | Takenaka et al. | |

FOREIGN PATENT DOCUMENTS

| | | |
|---|---|---|
| JP | 513451 B2 | 2/1993 |
| JP | 6-34455 A | 2/1994 |

(Continued)

OTHER PUBLICATIONS

Aslam, M. et al., "Piezoresistivity in vapor deposited diamond films." Applied physics letters 60.23 (1992): 2923-2925.*

(Continued)

*Primary Examiner* — Karen Kusumakar
*Assistant Examiner* — Adam S Bowen
(74) *Attorney, Agent, or Firm* — Hauptman Ham, LLP

(57) ABSTRACT

A force detection device includes a diamond piezoresistor including a highly orientated diamond into which boron is introduced as an impurity. The absolute value of the piezoresistance coefficient of the diamond piezoresistor is greater than the absolute value of a piezoresistance coefficient $\pi 11$ or $\pi 12$ in a case in which a major axis is in the <100> direction.

10 Claims, 27 Drawing Sheets

(56) References Cited

FOREIGN PATENT DOCUMENTS

| JP | 8-114520 A | 5/1996 |
|---|---|---|
| JP | 8-316495 A | 11/1996 |
| JP | 2009-139258 A | 6/2009 |
| JP | 2012-198196 A | 10/2012 |

OTHER PUBLICATIONS

Taher, I., et al., "Piezoresistive Microsensors using p-type CVD Diamond Films", Sensors and Actuators A, vol. 45, No. 1, pp. 35-43 1994.*
Werner, M., et al. "Review on diamond based piezoresistive sensors." Industrial Electronics, 1998. Proceedings. ISIE'98. IEEE International Symposium on. vol. 1. IEEE, 1998.*
Smith, Charles S. "Piezoresistance effect in germanium and silicon." Physical review 94.1 (1954): 42.*
Aslam, M., et al. "Piezoresistivity in vapor-deposited diamond films." Applied physics letters 60.23 (1992): 2923-2925.*
Bao, Minhang, et al. "Batch derivation of piezoresistive coefficient tensor by matrix algebra." Journal of Micromechanics and Microengineering14.3 (2004): 332.*
Werner, Matthias, et al. "Review on diamond based piezoresistive sensors." Industrial Electronics, 1998. Proceedings. ISIE'98. IEEE International Symposium on. vol. 1. IEEE, 1998.*
M. Aslam, et al., "Piezoresistivity in vapor-deposited diamond films", Appl. Phys. Lett 60 (23), Jun. 8, 1992, p. 2923-2925.
Barlian A A et al., "Review: Semiconductor Piezoresistance for Microsystems", Proceedings of the IEEE, IEEE. New York, US, vol. 97, No. 3, Mar. 1, 2009, pp. 513-552, XP011366222, ISSN: 0018-9219, DOI: 10.1109/JPROC.2009.2013612.
Gluche Pet al., "Application of highly oriented, planar diamond (HOD) films of high mechanical strength in sensor technologies", Diamond and Related Materials, Elsevier Science Publishers, Amsterdam, NL, vol. 7, No. 6, Jun. 1, 1998, pp. 779-782, XP004161190, ISSN: 0925-9635, DOI: 10.1016/S0925-9635(97)00303-8.

* cited by examiner

FIG. 6A

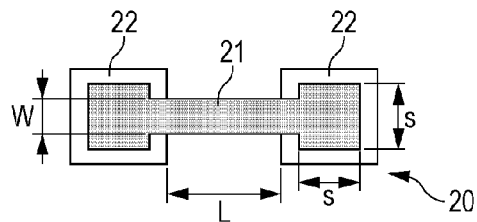

4.5ppm:
L=230μm
W=200μm
s=400μm

5000ppm:
L=530μm
W=90μm
s=200μm

FIG. 6B

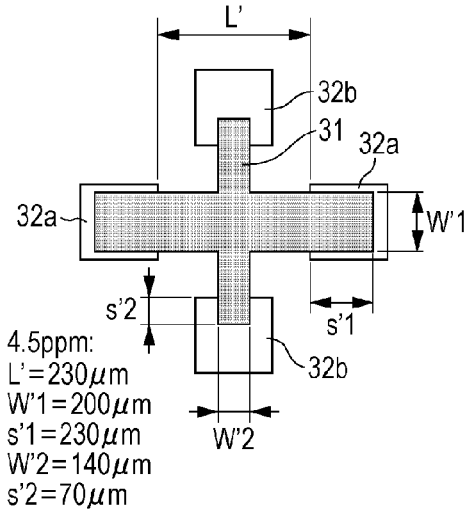

4.5ppm:
L'=230μm
W'1=200μm
s'1=230μm
W'2=140μm
s'2=70μm

5000ppm:
L'=530μm
W'1=90μm
s'1=230μm
W'2=90μm
s'2=80μm

FIG. 6C $$\begin{bmatrix} \Delta\rho_1/\rho_0 \\ \Delta\rho_2/\rho_0 \\ \Delta\rho_3/\rho_0 \\ \Delta\rho_4/\rho_0 \\ \Delta\rho_5/\rho_0 \\ \Delta\rho_6/\rho_0 \end{bmatrix} = \begin{bmatrix} \pi_{11} & \pi_{12} & \pi_{12} & 0 & 0 & 0 \\ \pi_{12} & \pi_{11} & \pi_{12} & 0 & 0 & 0 \\ \pi_{12} & \pi_{12} & \pi_{11} & 0 & 0 & 0 \\ 0 & 0 & 0 & \pi_{44} & 0 & 0 \\ 0 & 0 & 0 & 0 & \pi_{44} & 0 \\ 0 & 0 & 0 & 0 & 0 & \pi_{44} \end{bmatrix} \begin{bmatrix} \sigma_1 \\ \sigma_2 \\ \sigma_3 \\ \sigma_4 \\ \sigma_5 \\ \sigma_6 \end{bmatrix}$$

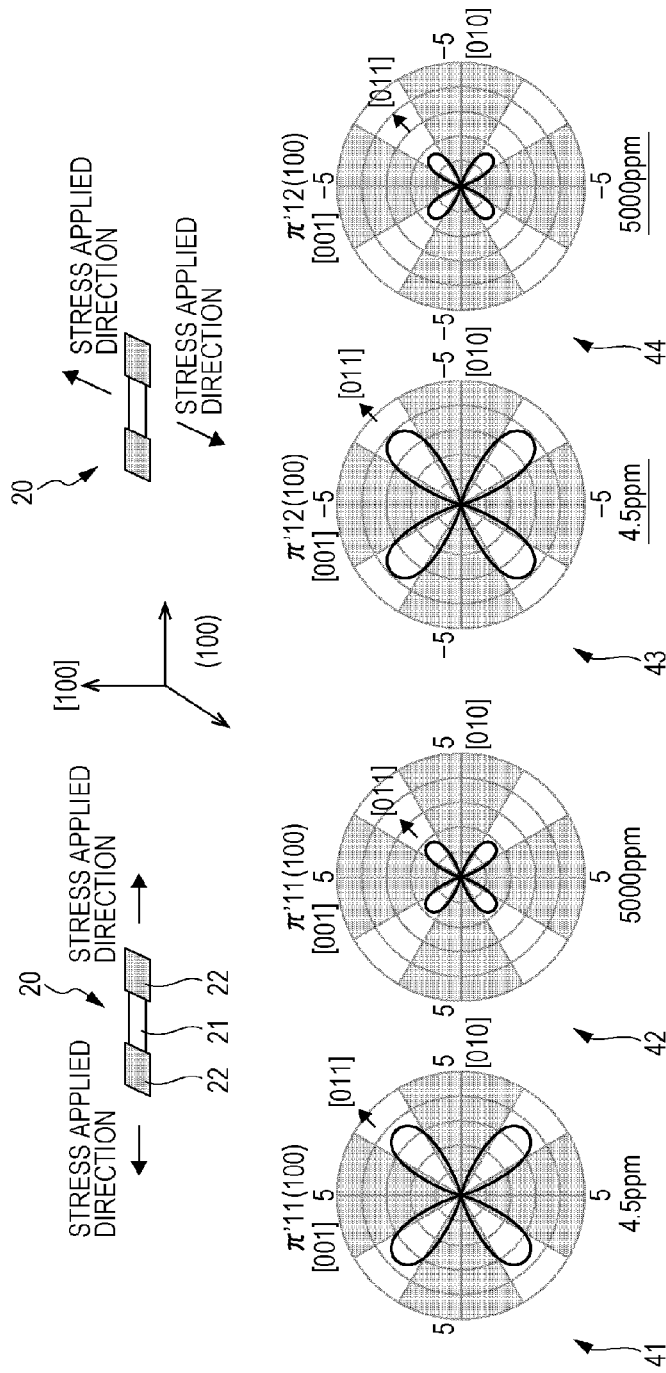

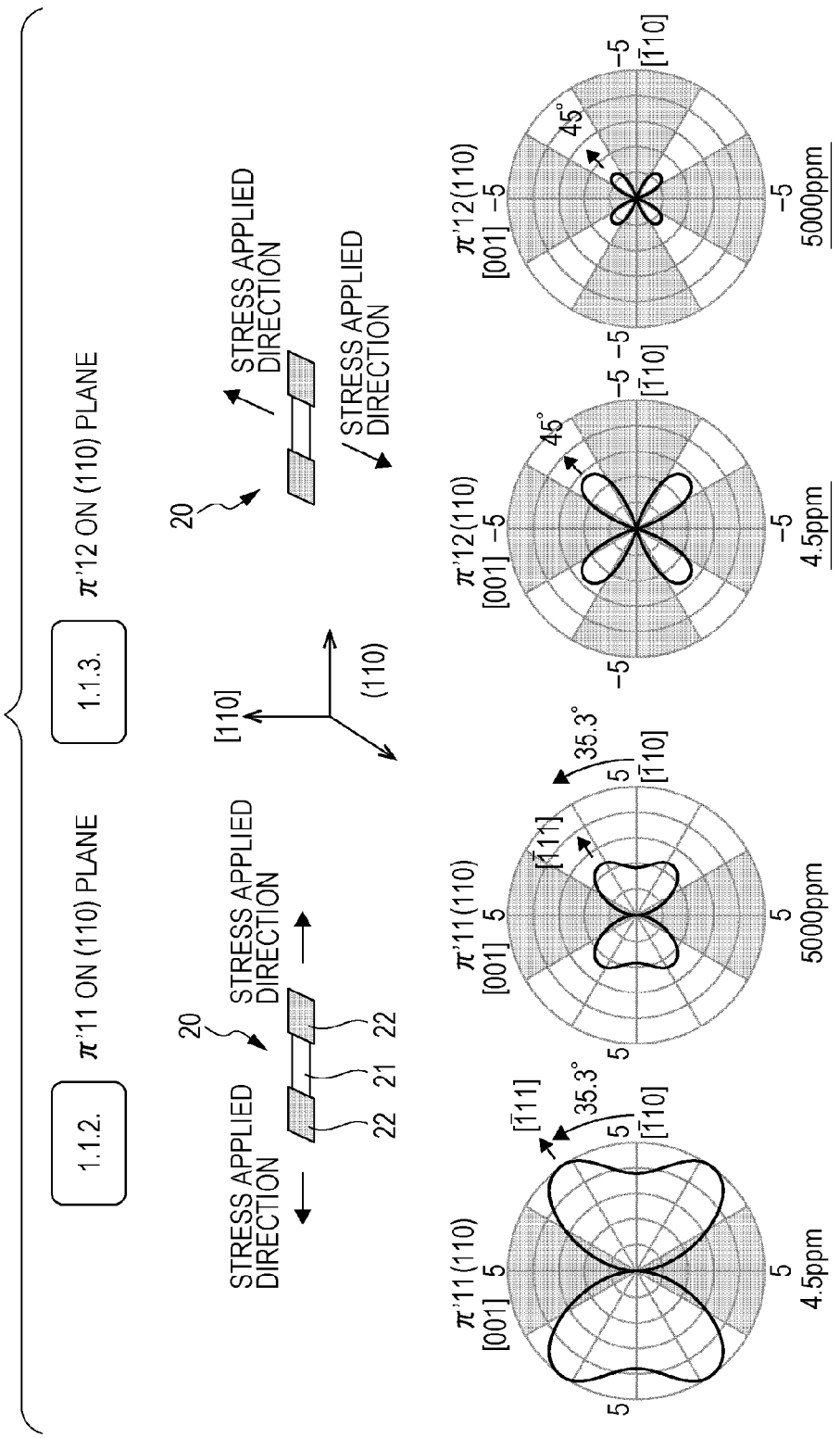

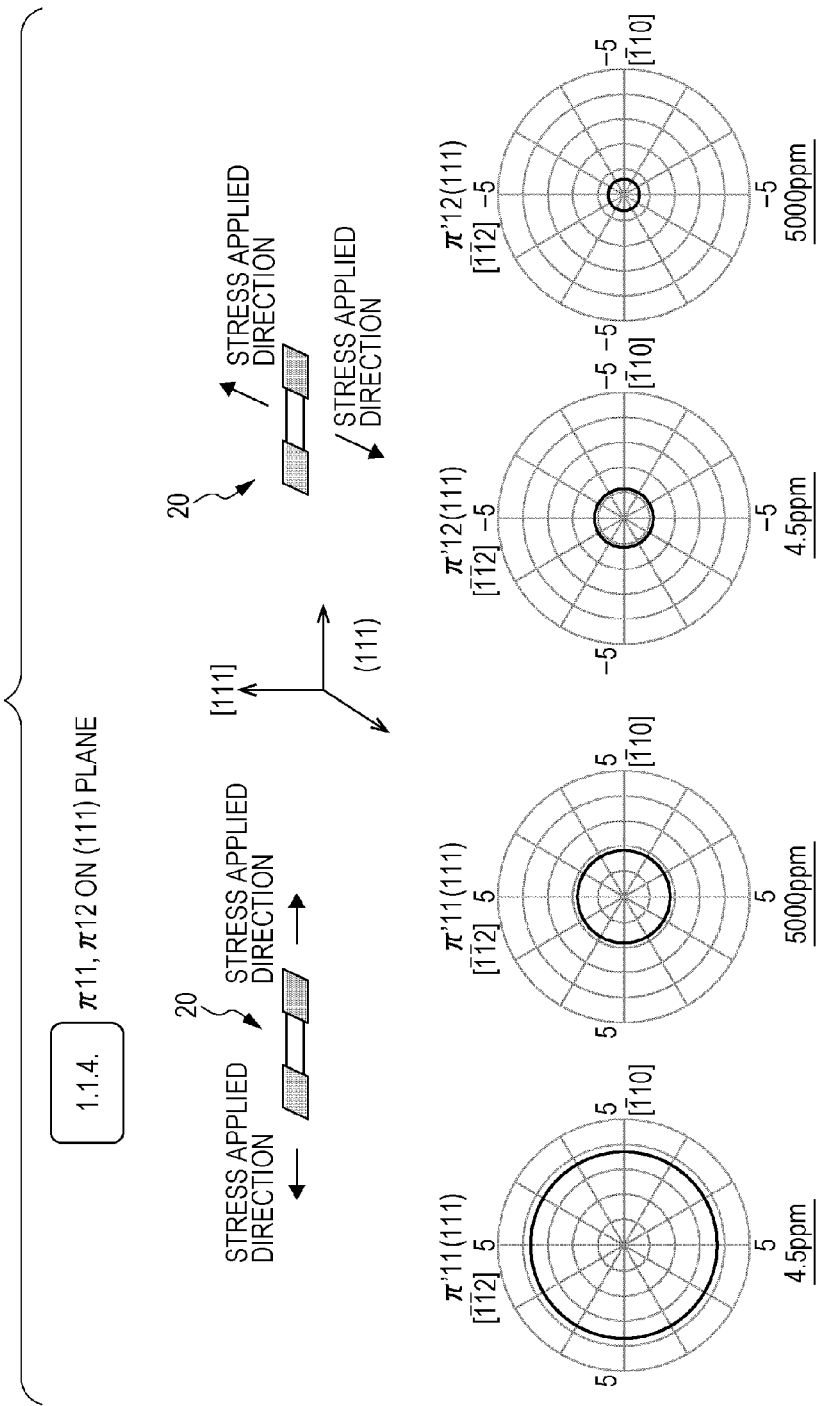

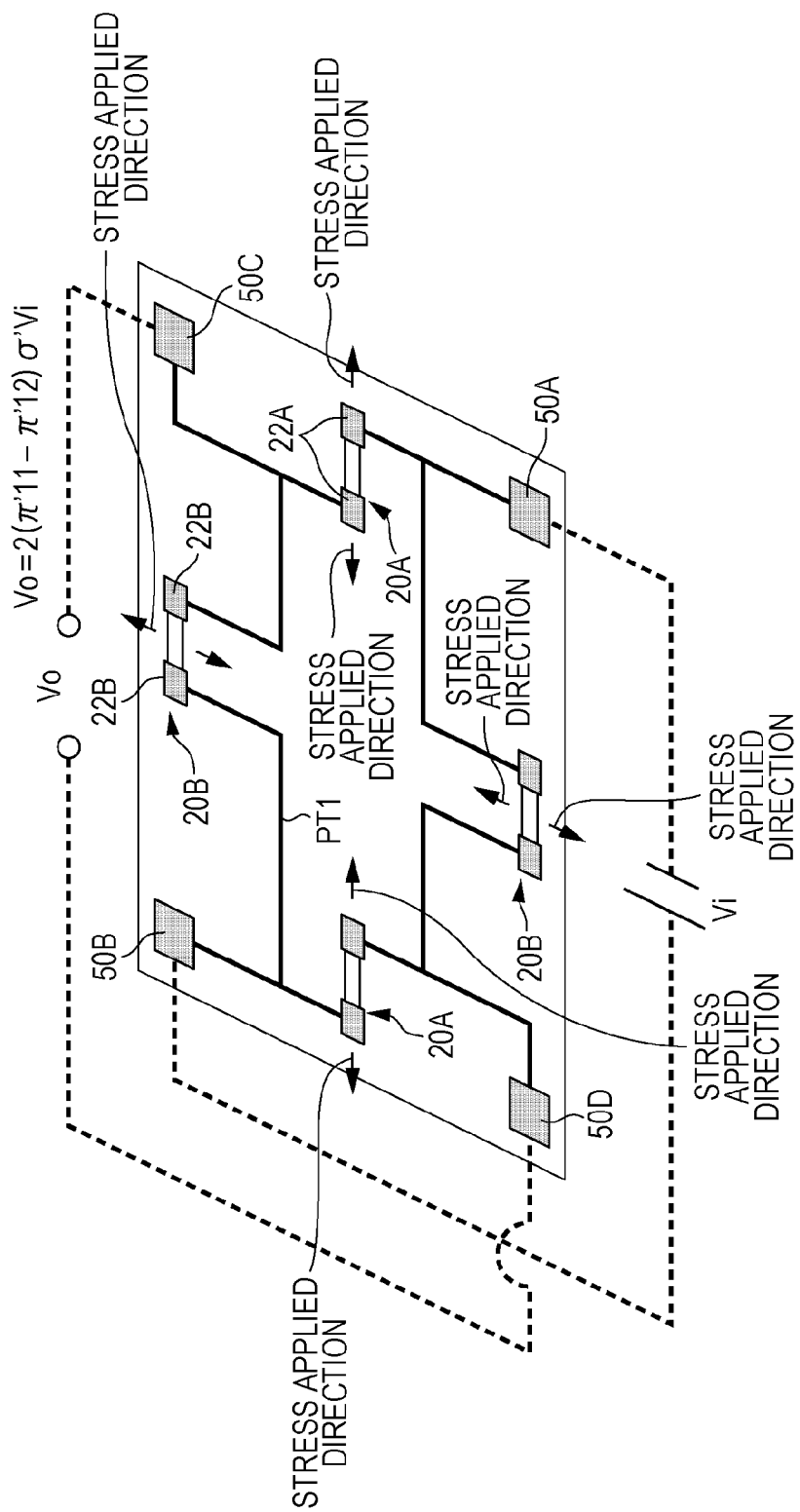

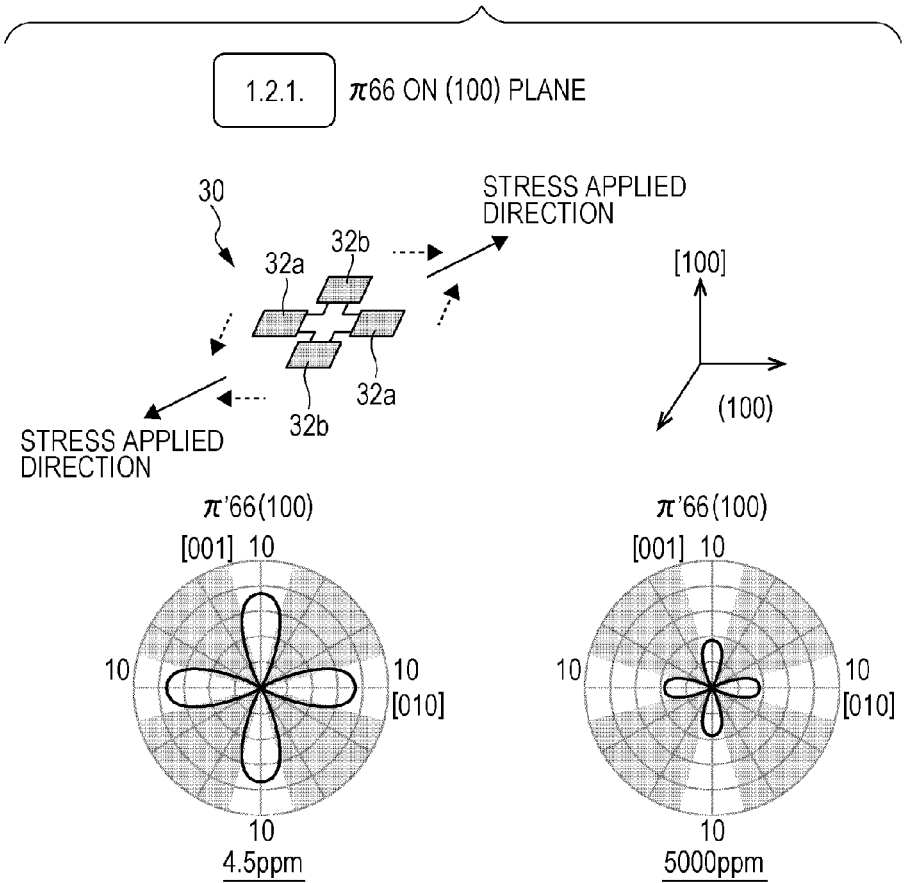

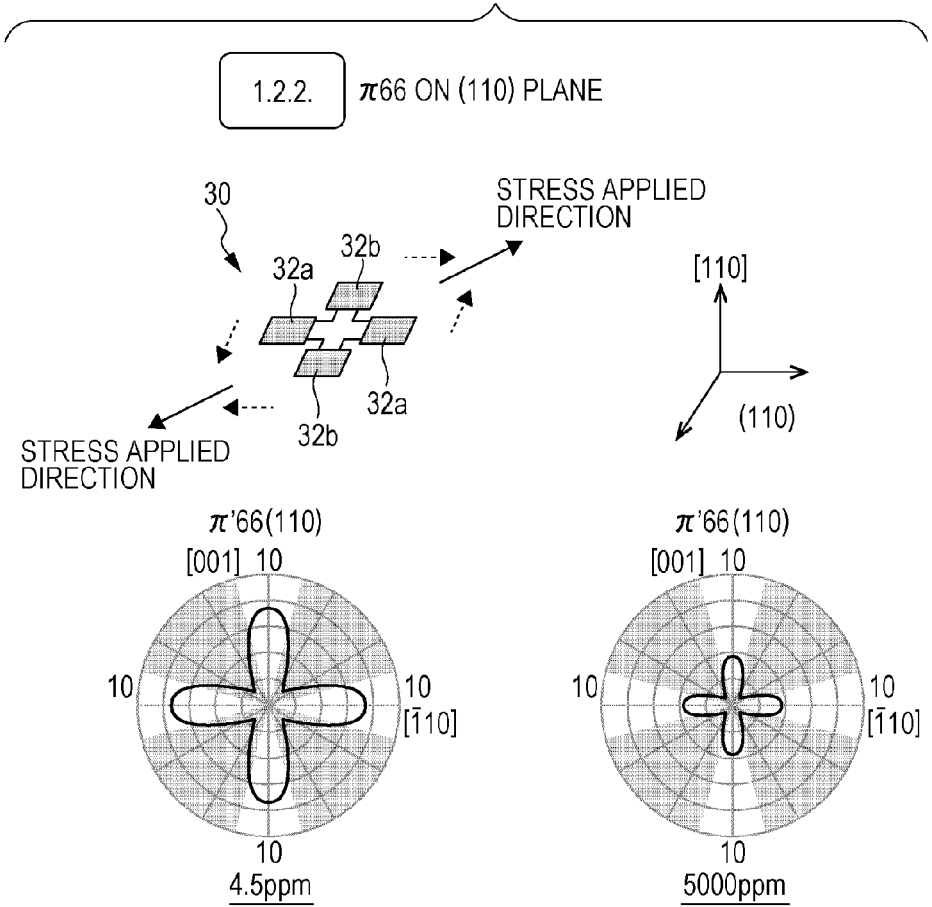

FIG. 15A
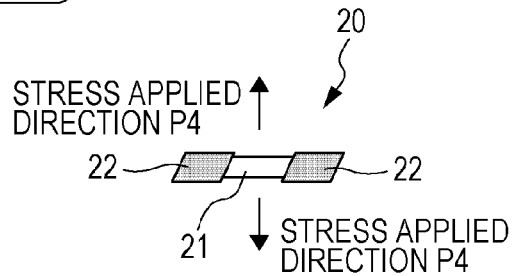
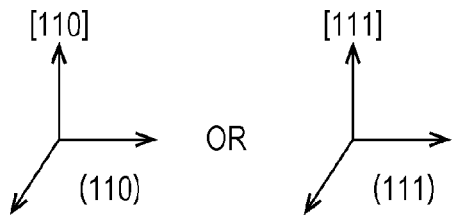
FIG. 15B
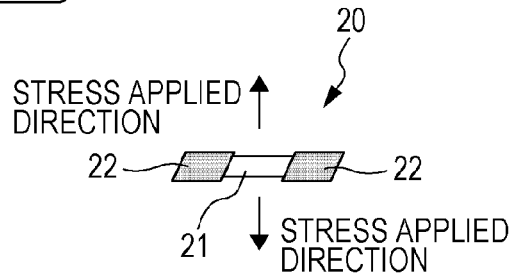
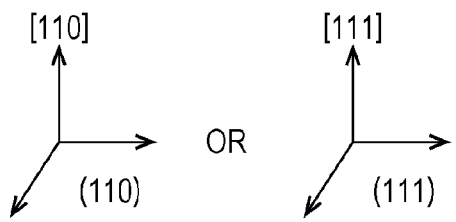

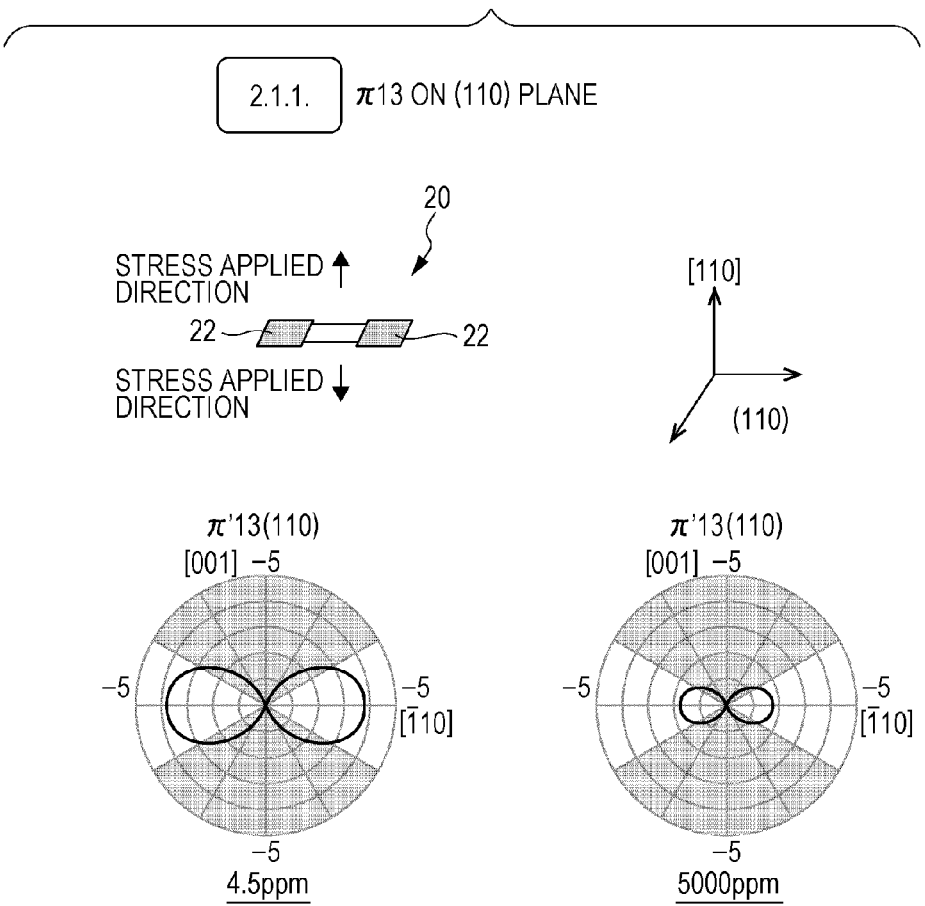

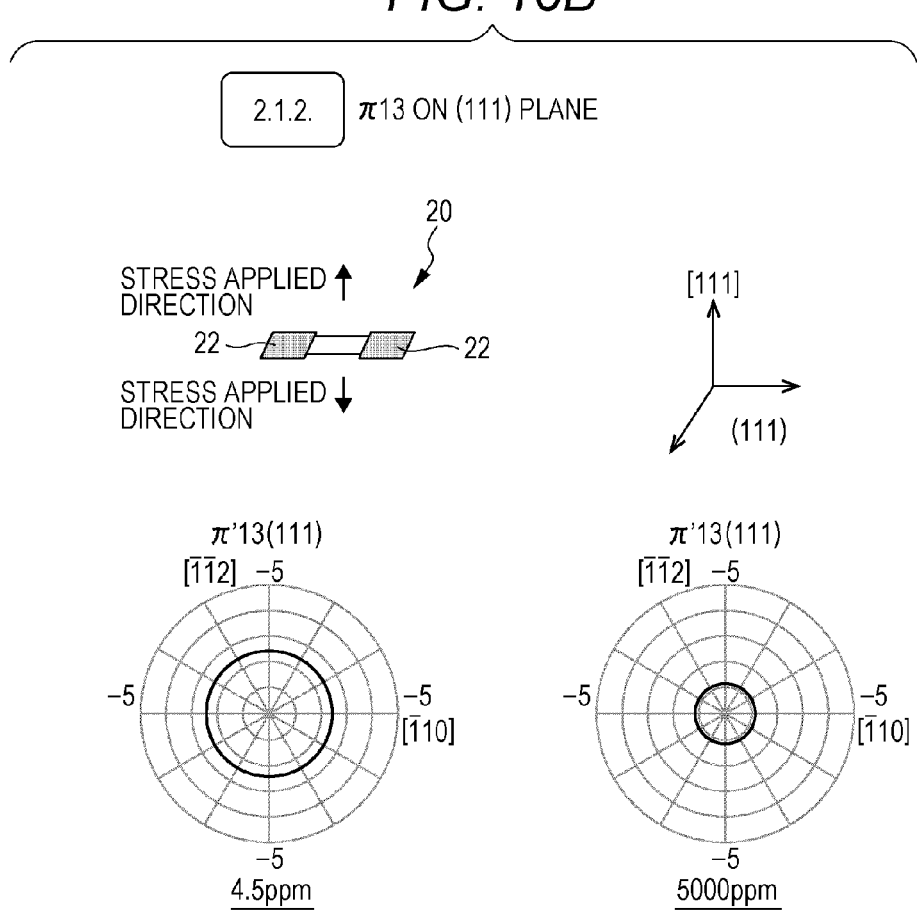

FIG. 20
2.2. π63 ON (110) PLANE
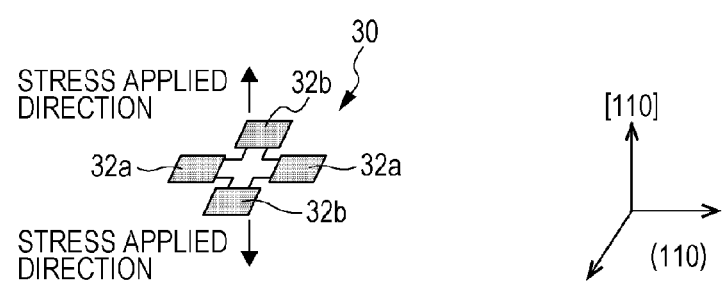
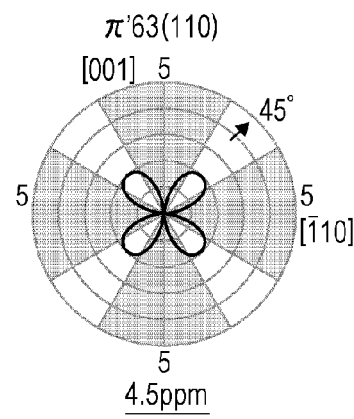
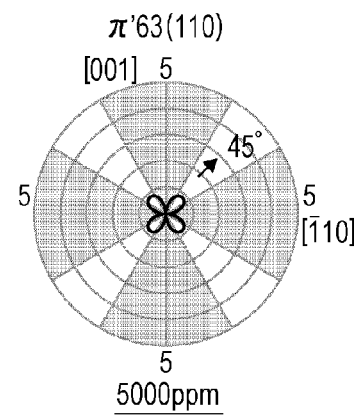

FIG. 24

DIRECTIONAL NOTATIONS ARE EXPRESSED BY USING
SQUARE BRACKETS, AS IN [u v w].
WHEN EQUIVALENT DIRECTIONS ARE EXPRESSED
COLLECTIVELY, ANGLE BRACKETS ARE USED, AS IN ⟨u v w⟩.
FOR EXAMPLE:

⟨100⟩=[100], [010], [001], [$\bar{1}$00], [0$\bar{1}$0], [00$\bar{1}$]

⟨110⟩=[110], [011], [101], [$\bar{1}$10], [1$\bar{1}$0], [$\bar{1}\bar{1}$0], [0$\bar{1}$1], [01$\bar{1}$], [0$\bar{1}\bar{1}$], [$\bar{1}$01], [10$\bar{1}$], [$\bar{1}$0$\bar{1}$]

⟨111⟩=[111], [$\bar{1}$11], [1$\bar{1}$1], [11$\bar{1}$], [$\bar{1}\bar{1}$1], [$\bar{1}$1$\bar{1}$], [1$\bar{1}\bar{1}$], [$\bar{1}\bar{1}\bar{1}$]

PLANAR NOTATIONS ARE EXPRESSED BY USING
ROUND BRACKETS, AS IN (u v w).
WHEN EQUIVALENT PLANES ARE EXPRESSED
COLLECTIVELY, CURLY BRACKETS ARE USED, AS IN {u v w}.
FOR EXAMPLE:

{100}=(100), (010), (001), ($\bar{1}$00), (0$\bar{1}$0), (00$\bar{1}$)

{110}=(110), (011), (101), ($\bar{1}$10), (1$\bar{1}$0), (110), (0$\bar{1}$1), (01$\bar{1}$), (0$\bar{1}\bar{1}$), ($\bar{1}$01), (10$\bar{1}$), ($\bar{1}$0$\bar{1}$)

{111}=(111), ($\bar{1}$11), (1$\bar{1}$1), (11$\bar{1}$), ($\bar{1}\bar{1}$1), ($\bar{1}$1$\bar{1}$), (1$\bar{1}\bar{1}$), ($\bar{1}\bar{1}\bar{1}$)

FORCE DETECTION DEVICE, AND FORCE TRANSDUCER DEVICE

CROSS-REFERENCE TO RELATED APPLICATION

This application is based on Japanese Patent Application No. 2013-090884 filed with the Japan Patent Office on Apr. 24, 2013, the entire content of which is hereby incorporated by reference.

BACKGROUND

1. Technical Field

The present disclosure relates to a force detection device and a force transducer device.

2. Related Art

A force detection device is provided with a piezoresistor including diamond into which boron is introduced as an impurity, for example. The force detection device utilizes the crystal orientation dependency of the piezoresistor.

JP-B-5-13451 discloses a pressure detector. The pressure detector includes a tubular housing protruding into a measurement atmosphere. The housing includes a pressure chamber into which a measurement pressure is introduced. A part of chamber walls of the pressure chamber includes a diaphragm that is deformed in accordance with a change in the measurement pressure. The diaphragm is disposed with a strain gauge that produces an output signal corresponding to a strain in the diaphragm. The strain gauge includes a diamond semiconductor film formed on a diamond single-crystal plate.

The specification according to U.S. Pat. No. 5,303,594 discloses a high-temperature, high-sensitivity pressure sensor including a diamond piezoresistor/$SiO_2$/SiC diaphragm configuration.

In "Piezoresistivity in vapor-deposited diamond films", Appl. Phys. Lett. 60 (23) 8 Jun. 1992, the piezoresistive effect of a piezoresistor formed on the (100) plane of a substrate in the [100] direction is described.

SUMMARY

A force detection device includes a diamond piezoresistor including a highly orientated diamond into which boron is introduced as an impurity. The absolute value of the piezoresistance coefficient of the diamond piezoresistor is greater than the absolute value of a piezoresistance coefficient $\pi 11$ or $\pi 12$ in a case in which a major axis is in the <100> direction.

BRIEF DESCRIPTION OF DRAWINGS

FIGS. 6A and 6B are diagrams illustrating the dimensions and the like of single-crystal diamond piezoresistors, and illustrate dimensions of single-crystal diamond piezoresistors used in an experiment, and FIG. 6C is a matrix notation in a case in which the major axis is in the <100> direction;

FIGS. 9A and 9B illustrate specific examples of the force detection device based on in-plane perpendicular stress;

FIG. 10 is a diagram illustrating specific examples of the force detection device based on in-plane perpendicular stress;

FIG. 11 is a perspective view illustrating a configuration of a Wheatstone bridge.

FIGS. 13A and 13B are diagrams illustrating specific examples of the force detection device based on in-plane shearing stress;

FIGS. 15A and 15B are diagrams illustrating structures of a force detection device based on out-of-plane stress;

FIGS. 16A and 16B are diagrams illustrating specific examples of the force detection device based on out-of-plane stress;

FIG. 20 is a diagram illustrating a specific example of the force detection device based on out-of-plane stress;

FIG. 24 is a diagram illustrating examples of the "equivalent" directions and the "equivalent" planes.

DETAILED DESCRIPTION

Figure 1:
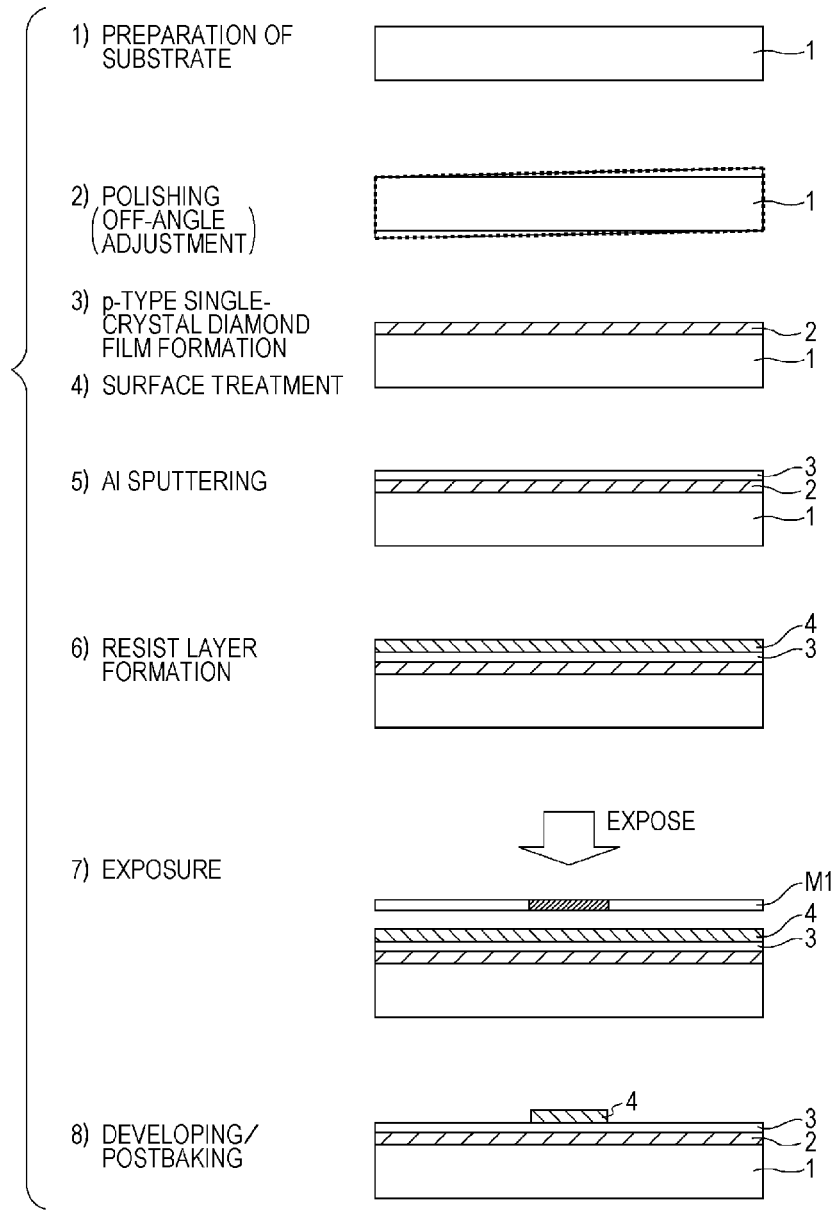
FIG. 1 is a diagram illustrating a process of fabricating a piezoresistor using epitaxial diamond.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

JP-B-5-13451 does not discuss the crystal orientation dependency of a diamond semiconductor film. Further, the specification according to U.S. Pat. No. 5,303,594 does not discuss piezoresistor fabrication using diamond with aligned crystal orientation, nor the utilization of the crystal orientation dependency of a diamond piezoresistor. In "Piezoresistivity in vapor-deposited diamond films", Appl. Phys. Lett. 60 (23) 8 Jun. 1992, the piezoresistive effect of the piezoresistor formed on the (100) plane of a substrate in the [100] direction is disclosed. However, as will be described below, it has been found that crystal orientation dependency leads to a remarkable decrease in piezoresistance coefficient of the piezoresistor on the (100) plane in the [100] direction.

An object of the present disclosure is to provide a force detection device and the like that utilizes the crystal orientation dependency of a piezoresistor including a highly orientated diamond.

A force detection device (the present force detection device) according to an embodiment of the present disclosure includes a diamond piezoresistor including a highly orientated diamond into which boron is introduced as an impurity. The absolute value of the piezoresistance coefficient of the diamond piezoresistor is greater than the absolute value of a piezoresistance coefficient $\pi 11$ or $\pi 12$ in a case in which a major axis is in a <100> direction.

According to the force detection device, the diamond piezoresistor is formed such that the absolute value of the piezoresistance coefficient of the diamond piezoresistor is greater than the absolute value of the piezoresistance coefficient $\pi 11$ or $\pi 12$ when the major axis is in the <100> direction. Thus, various force detection devices or force transducer devices can be obtained by utilizing the crystal orientation dependency of the piezoresistor using highly orientated diamond.

The present force detection device further includes: a diamond substrate; and a pair of input electrodes opposed to each other on the diamond piezoresistor. The diamond piezoresistor may be formed on a (100) plane, a (110) plane, a (111) plane, or a crystal plane equivalent thereto of the diamond substrate; and the diamond piezoresistor may be subjected to a stress applied in a direction that is aligned with or perpendicular to the pair of input electrodes or may be a shearing direction with respect to the pair of input electrodes.

In the present force detection device, the pair of input electrodes may be a pair of common input/output electrodes opposed to each other at the ends of the diamond piezoresistor; and the direction of application of the stress to the diamond piezoresistor may be aligned with or perpendicular to the pair of common input/output electrodes.

In the present force detection device, the diamond piezoresistor may be formed on the (100) plane or a crystal plane equivalent thereto of the diamond substrate; and the pair of common input/output electrodes may be disposed at an angle in the range of −15° to +15° relative to the [011] direction or a crystal direction equivalent thereto.

In the present force detection device, the diamond piezoresistor may be formed on the (110) plane or a crystal plane equivalent thereto of the diamond substrate; the pair of common input/output electrodes may be disposed at an angle in a range of −60° to +60° relative to the [110] direction or a crystal direction equivalent thereto; and the direction of application of the stress to the diamond piezoresistor may be aligned with the pair of common input/output electrodes.

In the present force detection device, the diamond piezoresistor may be formed on the (110) plane or a crystal plane equivalent thereto of the diamond substrate; the pair of common input/output electrodes may be disposed at an angle in a range of −15° to +15° relative to a direction displaced by 45° from the [110] direction or a crystal direction equivalent thereto; and the direction of application of the stress to the diamond piezoresistor may be perpendicular to the pair of common input/output electrodes.

In the present force detection device, the diamond piezoresistor may be formed on the (111) plane or a crystal plane equivalent thereto of the diamond substrate.

The present force detection device includes a Wheatstone bridge including two sets of the diamond piezoresistors opposed to each other. The direction of application of the stress to one set of the diamond piezoresistors may be aligned with the pair of common input/output electrodes; and the direction of application of the stress to the other set of the diamond piezoresistors may be perpendicular to the pair of common input/output electrodes.

The present force detection device further includes a pair of output electrodes opposed to each other and disposed orthogonal to the pair of input electrodes. The direction of application of the stress to the diamond piezoresistor may be a shearing direction with respect to the pair of input electrodes.

In the present force detection device, the diamond piezoresistor may be formed on the (100) plane or a crystal plane equivalent thereto of the diamond substrate; and the pair of input electrodes opposed to each other may be disposed at an angle in a range of −15° to +15° relative to the [010] direction or a crystal direction equivalent thereto.

In the present force detection device, the diamond piezoresistor may be formed on the (110) plane or a crystal plane equivalent thereto of the diamond substrate; and the pair of input electrodes opposed to each other may be disposed at an angle in a range of −15° to +15° relative to the [110] direction, the [001] direction, or a crystal direction equivalent thereto.

In the present force detection device, the diamond piezoresistor may be formed on the (111) plane or a crystal plane equivalent thereto of the diamond substrate.

The present force detection device further includes: a diamond substrate; and a pair of input electrodes opposed to each other on the diamond piezoresistor. The diamond piezoresistor may be formed on the (110) plane, the (111) plane, or a crystal plane equivalent thereto of the diamond substrate; and the diamond piezoresistor may be subjected to a stress applied in a plane which is the (110) plane, the (111) plane, or a crystal plane equivalent thereto.

In the present force detection device, the pair of input electrodes may be a pair of common input/output electrodes opposed to each other at the ends of the diamond piezoresistor.

In the present force detection device, the diamond piezoresistor may be formed on the (110) plane or a crystal plane equivalent thereto of the diamond substrate; the pair of common input/output electrodes may be disposed at an angle in a range of −30° to +30° relative to the [110] direction or a crystal direction equivalent thereto; and the plane of application of the stress to the diamond piezoresistor may be the (110) plane or a crystal plane equivalent thereto.

In the present force detection device, the diamond piezoresistor may be formed on the (111) plane or a crystal plane equivalent thereto of the diamond substrate; and the plane of application of the stress to the diamond piezoresistor may be the (111) plane or a crystal plane equivalent thereto.

The present force detection device includes a Wheatstone bridge including two sets of the diamond piezoresistors opposed to each other. The diamond piezoresistor may be formed on the (110) plane or a crystal plane equivalent thereto of the diamond substrate; the pair of common input/output electrodes opposed to each other at the ends of one set of the diamond piezoresistors may be disposed at an angle in a range of −30° to +30° relative to the [110] direction or a crystal direction equivalent thereto; and the pair of common input/output electrodes opposed to each other at the ends of the other set of the diamond piezoresistors may be disposed at an angle in a range of −30° to +30° relative to the [001] direction or a crystal direction equivalent thereto.

The present force detection device includes a Wheatstone bridge including two sets of the diamond piezoresistors opposed to each other. The stress may be applied to only one set of the diamond piezoresistors.

In the present force detection device, the pair of common input/output electrodes opposed to each other at the ends of the one set of the diamond piezoresistors to which the stress is applied may be disposed in the [110] direction or a crystal direction equivalent thereto.

In the present force detection device, the one set of the diamond piezoresistors to which the stress is applied may have a thickness greater than a thickness of the other set of the diamond piezoresistors.

The present force detection device further includes a pair of output electrodes opposed to each other and disposed orthogonal to the pair of input electrodes. The diamond piezoresistor may be formed on the (110) plane or a crystal plane equivalent thereto of the diamond substrate; the pair of input electrodes opposed to each other may be disposed at an angle in a range of −15° to +15° relative to a direction displaced by 45° from the [110] direction or a crystal direction equivalent thereto; and the plane of application of the stress to the diamond piezoresistor may be the (110) plane or a crystal plane equivalent thereto.

A force transducer device (the present force transducer device) according to an embodiment of the present disclosure includes: the present force detection device; a buffer block bonded to the plane in which the stress is applied to the diamond piezoresistor; and a pressure-receiving substrate bonded to a plane of the buffer block opposite to the plane to which the diamond piezoresistor is bonded, the pressure-receiving substrate being configured to apply compressive force to the buffer block. The buffer block may have a coefficient of thermal expansion smaller than a coefficient of thermal expansion of the pressure-receiving substrate.

The present force transducer device includes: the present force detection device in which the diamond substrate is a single-crystal diamond pressure-receiving substrate; and a buffer block bonded to the plane in which the stress is applied to the diamond piezoresistor. The diamond piezoresistor may receive compressive force from the buffer block when compressive force is applied from a rear surface of the single-crystal diamond pressure-receiving substrate.

In the present force detection device, the diamond piezoresistor may include a single-crystal diamond or a hetero-epitaxial diamond.

In the present force detection device, the diamond piezoresistor includes a diamond laminated body; and the diamond laminated body may include a high-concentration boron-doped epitaxial diamond, a low-concentration boron-doped epitaxial diamond, and a high-concentration boron-doped epitaxial diamond that are laminated in this order in a planar direction.

According to the present force detection device and the present force transducer device, the diamond piezoresistor is formed such that the absolute value of the piezoresistance coefficient of the diamond piezoresistor is greater than the absolute value of the piezoresistance coefficient $\pi 11$ or $\pi 12$ when the major axis is in the <100> direction. Thus, various force detection devices or force transducer devices can be obtained by utilizing the crystal orientation dependency of the piezoresistor using highly orientated diamond.

Hereinafter, an embodiment of a force transducer device according to the present disclosure will be described.
<Outline>

A force detection device according to the present embodiment (the present force detection device) is provided with a diamond piezoresistor including a highly orientated diamond into which boron is introduced as an impurity. In the present force detection device, the diamond piezoresistor is formed such that the absolute value of the piezoresistance coefficient of the diamond piezoresistor is greater than the absolute value of a piezoresistance coefficient $\pi 11$ or $\pi 12$ in a case in which the major axis is in the <100> direction.

The present force detection device is provided with the diamond piezoresistor including the highly orientated diamond into which boron is introduced as an impurity. The diamond into which boron is introduced as an impurity can be produced as an epitaxial diamond.

The epitaxial diamond refers to a diamond deposited and grown on a substrate crystal such that a crystal is grown on the substrate crystal and brought into a certain crystal orientation relationship with the substrate crystal. Diamond is one allotrope of carbon. Inside the crystal, carbon atoms are covalently bonded to each other. When an impurity such as boron or phosphorus is incorporated at a substitution position in the diamond single crystal, an acceptor or a donor is formed, whereby p-type or n-type semiconductor characteristics are produced. Attempts have been made to utilize the epitaxial diamond in ultraviolet ray emitting devices, power devices, or electron emitting source devices, for example, by taking advantage of the semiconductor characteristics.

The piezoresistive effect is a phenomenon in which the resistivity of a crystal is changed when the crystal is subjected to stress or strain. For example, when an external force acts on a semiconductor material, such as single-crystal silicon, strain is caused in the crystal lattice. As a result, the energy state of a conduction band and/or a valance band is changed. This causes a change in the number of carriers in the band and/or mobility, causing a change in macroscopic electrical conductivity or resistivity. Such characteristics are widely utilized as a principle of detection by a physical sensor, such as a strain sensor or a pressure sensor. According to the present embodiment, a resistor that produces the piezoresistive effect will be referred to as a "piezoresistor".

The crystal orientation dependency refers to a phenomenon in which, in a crystal material having a specific anisotropy, the characteristics are varied depending on the orientation of the crystal plane. Epitaxial diamond is a crystal material and has a specific anisotropy. It is generally known that the epitaxial diamond has crystal orientation dependency with respect to the Young's modulus and the Poisson ratio. It was also reported by C. S. Smith in 1954 that the piezoresistance coefficient of silicon and germanium produces crystal orientation dependency. However, with respect to the epitaxial diamond, evaluation is difficult in terms of diamond crystallization technique, impurity doping technique, and processing technique, and no report of evaluation has been made. In recent years, thanks to developments in the techniques, various devices using the epitaxial diamond can be evaluated. Thus, the inventor associated with the present disclosure experimentally fabricated a piezoresistor using the epitaxial diamond and conducted an evaluation. As a result, it was discovered that crystal orientation dependency is caused in the piezoresistor using epitaxial diamond.

In the present force detection device, an epitaxial diamond into which an impurity is introduced is used as a piezoresistor. Namely, the present force detection device utilizes the lately discovered crystal orientation dependency of the piezoresistor using the epitaxial diamond. Thus, the present force detection device can produce an output corresponding to stress acting on the highly orientated diamond piezoresistor formed in a specific plane and direction.

As a conventional example of a force detection device, a piezoresistor uses a p-type or n-type silicon semiconductor into which an impurity such as boron, phosphorus, or arsenic is introduced. However, the bandgap of Si is about 1.1 eV and thus small, limiting the temperature for use to the order of 150° C. In the present force detection device, epitaxial diamond is used as the piezoresistor. Diamond has a large bandgap of approximately 5.5 eV, which enables the fabrication of a piezoresistor that can maintain semiconductor characteristics under high temperature environment (such as at 500° C.).

Under high temperature environment, the metal casing housing the piezoresistor is thermally expanded or contracted. In this case, the range of stress that can be applied to the piezoresistor is narrowed by the stress applied to the piezoresistor. Diamond has a very high compressive strength of 9 GPa and a very high tensile strength of 2 to 3 GPa. Accordingly, by using a highly orientated diamond piezoresistor, the ratio of decrease in dynamic range can be significantly narrowed.

In a conventional piezoresistor using diamond, such as discussed in the specification of U.S. Pat. No. 5,303,594, a film of polycrystalline diamond formed on a Si substrate and the like is used. Typical polycrystalline diamond is an aggregate of a large number of crystal grains having different crystal axis directions, thereby exhibiting almost no crystal orientation dependency.

In the following thesis, a change in resistance of the piezoresistor is evaluated by applying stress to a single-crystal diamond piezoresistor in a uniaxial direction.

"Piezoresistivity in vapor-deposited diamond films", Appl. Phys. Lett. 60 (23) 8 Jun. 1992

The thesis discusses the piezoresistive effect of the piezoresistor formed on the (100) plane of a substrate in the [100] direction. In this connection, an experiment conducted by the present inventor concluded that crystal orientation dependency leads to a remarkable decrease in piezoresistance coefficient of the piezoresistor on the (100) plane in the [100] direction. There is no specific description about crystal orientation dependency in the thesis. In another example, JP-B-5-13451 describes a strain gauge including a diamond single-crystal plate and a diamond semiconductor film formed on the diamond single-crystal plate. However, there is no description of crystal orientation dependency in this publication, either.

By utilizing the crystal orientation dependency of the piezoresistor using highly orientated diamond, it becomes possible to fabricate a force detection device or force transducer device of various configurations. It also becomes possible to handle a diamond piezoresistor to which an out-of-plane stress is applied instead of an in-plane stress.

When the crystal plane of the substrate (diamond substrate) on which the piezoresistor is formed is the (111) plane or a crystal plane equivalent thereto, the direction dependency of the piezoresistance coefficient is eliminated, and the piezoresistance coefficient has a constant value. Thus, even when a directional error of the diamond piezoresistor is caused, the piezoresistance coefficient is constant. As a result, individual differences can be minimized.

When the diamond piezoresistor is formed on the substrate (diamond substrate), the plane orientation of the diamond piezoresistor is aligned with the crystal plane of the substrate.

It is also possible to configure a Wheatstone bridge by using the diamond piezoresistors. In this case, by utilizing the crystal orientation dependency of the highly orientated diamond, a set of diamond piezoresistors with piezoresistance coefficients of the opposite, i.e., positive and negative, signs may be formed, and a Wheatstone bridge may be configured by using the set. In this way, compared with when a single diamond piezoresistor is used, a large output can be obtained from the Wheatstone bridge. Further, the temperature dependency of resistance values can be cancelled.

By using the crystal orientation dependency of the highly orientated diamond, a shearing-type gauge can be configured. In this case, the temperature dependency of resistance values can be cancelled with a single resistor, as in the case of the Wheatstone bridge. Thus, the size of the shearing-type gauge can be decreased.

As described above, by utilizing the crystal orientation dependency of the piezoresistor using highly orientated diamond, a force detection device or force transducer device of various configurations that can be used stably under high temperature environment can be fabricated.

<Diamond Piezoresistor Fabrication Process>

Figure 2:
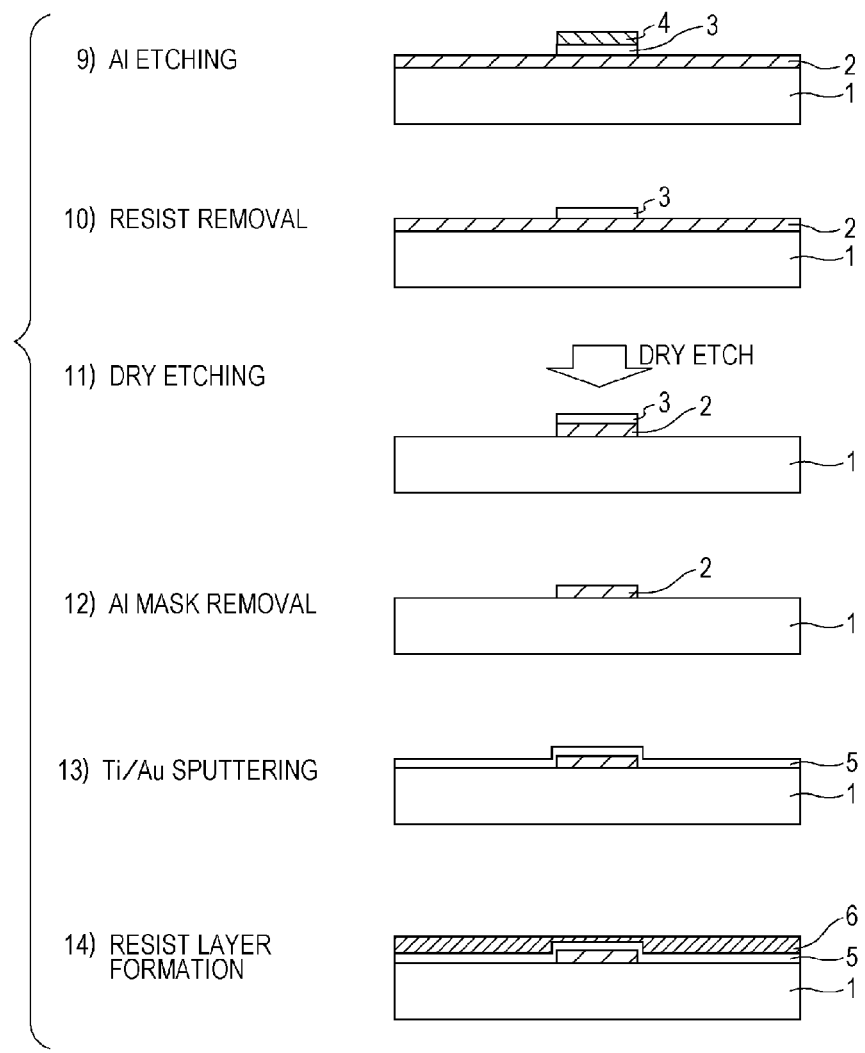
FIG. 2 is a diagram illustrating the process of fabricating the piezoresistor using epitaxial diamond.
Figure 3:
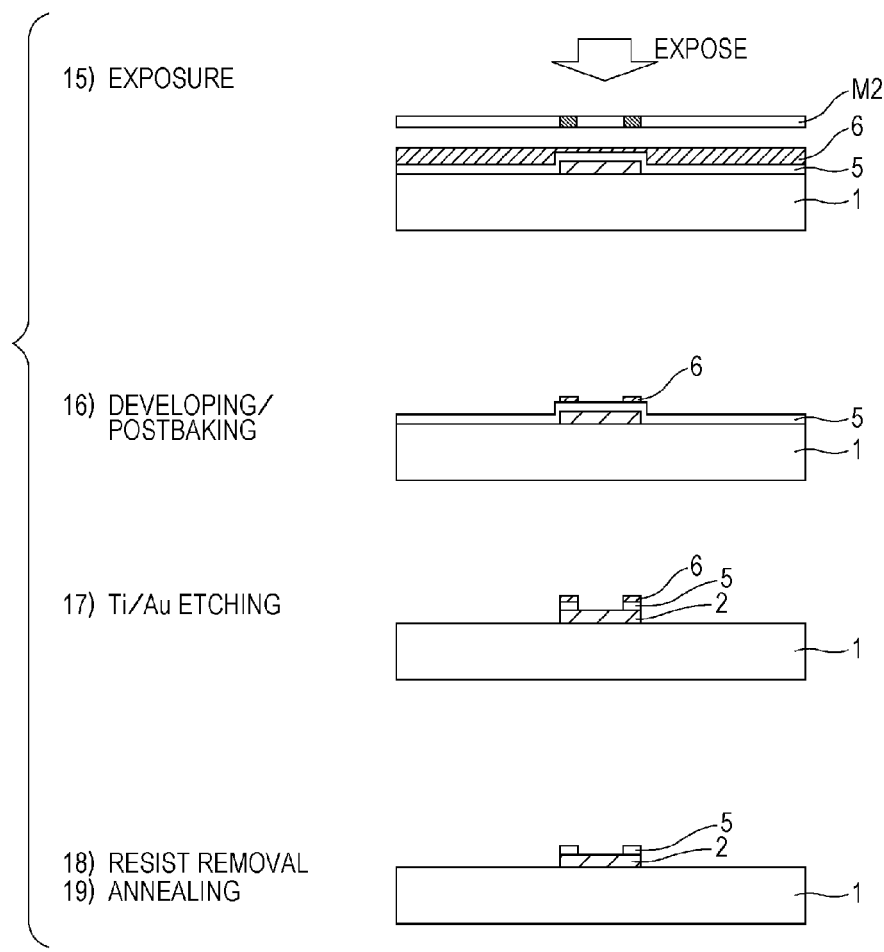
FIG. 3 is a diagram illustrating the process of fabricating the piezoresistor using epitaxial diamond.

With reference to FIGS. 1 to 3, a process of fabricating a piezoresistor using epitaxial diamond will be described. The present embodiment (present experiment), employs as an epitaxial diamond a single-crystal diamond homoepitaxially grown on a single-crystal diamond substrate.

[Formation of Single-Crystal Diamond Film]

1) A single-crystal diamond substrate 1 is prepared (FIG. 1). The single-crystal diamond substrate 1 has a length of 3.0 mm, a width of 3.0 mm, and a thickness of 0.15 mm, and has the {100} plane and the <100> end.

2) The single-crystal diamond substrate 1 is polished to produce a predetermined minute inclination (off-angle) in the {100} plane (FIG. 1).

3) Step-flow growth is performed on the single-crystal diamond substrate 1 with the off-angle by CVD process (vapor phase synthesis), while a predetermined concentration of boron is added as an impurity. In this way, 5 μm of a p-type single-crystal diamond film 2 is grown (FIG. 1). In the present experiment, two different gaseous phase concentrations (4.5 ppm and 5000 ppm) of boron with respect to carbon are used during epitaxial growth.

4) Surface treatment by hot mixed acid is performed so as to remove a hydrogen-terminated surface conductive layer and graphite components from the surface of the p-type single-crystal diamond film 2 (FIG. 1).

[Fabrication of Single-Crystal Diamond Piezoresistor]

5) Al sputtering is performed on the surface of the p-type single-crystal diamond film to form an aluminum film 3 with a thickness of 1 μm (FIG. 1).

6) The Al-sputtered surface is spray-coated with a photoresist (positive type) 4. The photoresist 4 is baked in a thermostatic oven for drying and increasing adhesion between the photoresist 4 and the underlayer (FIG. 1).

7) A pattern is transferred onto the photoresist 4 by exposure using a photomask M1 with the pattern drawn thereon (FIG. 1).

8) The exposed portions of the photoresist 4 are removed with liquid developer, followed by postbaking (FIG. 1).

9) The aluminum film 3 is etched by using the remaining pattern of the photoresist 4 as a mask (FIG. 2).

10) The photoresist 4 is removed with acetone (FIG. 2).

11) The p-type single-crystal diamond film 2 is dry etched by RIE (reactive ion etching) using the pattern of the aluminum film 3 as a mask. Etching conditions include an $O_2$ gas flow rate of 45 sccm, a $CF_4$ gas flow rate of 5 sccm, and an RF output of 100 W. The p-type single-crystal diamond film 2 in the areas other than the area under the mask is etched to approximately 7.5 μm. Thus, the surface of the insulating single-crystal diamond substrate 1 is exposed (FIG. 2).

12) The Al mask by the aluminum film 3 is removed with aluminum etching solution. Thus, a single-crystal diamond piezoresistor is fabricated (FIG. 2).

[Photolithography of Wiring]

13) Sputtering is performed on the face of the substrate on which the single-crystal diamond piezoresistor is fabricated, using Ti (1000 Å) and Au (3000 Å) in this order. Thus, a Ti/Au film 5 is formed (FIG. 2).

14) The face of the substrate on which sputtering has been performed is spray-coated with a photoresist (positive type) 6. The photoresist 6 is baked in the thermostatic oven for drying while increasing adhesion between the photoresist 6 and the underlayer (FIG. 2).

15) A photomask M2 drawn with a pattern different from the pattern of the mask used for piezoresistor fabrication is prepared. By performing exposure using the photomask M2, the pattern is transferred onto the photoresist 6 (FIG. 3).

16) The exposed portions of the photoresist 6 are removed with liquid developer, followed by postbaking (FIG. 3).

17) The Ti/Au film 5 is etched in the order of Au and Ti using the pattern of the photoresist 6 as a mask (FIG. 3).

18) The photoresist 6 is removed with acetone (FIG. 3).

19) In order to decrease ohmic contact and improve adhesion between the diamond piezoresistor and Ti, annealing is performed in a vacuum furnace at 520° C. for an hour (FIG. 3).

<Crystal Orientation Dependency of Diamond Piezoresistor>

Figure 4A:
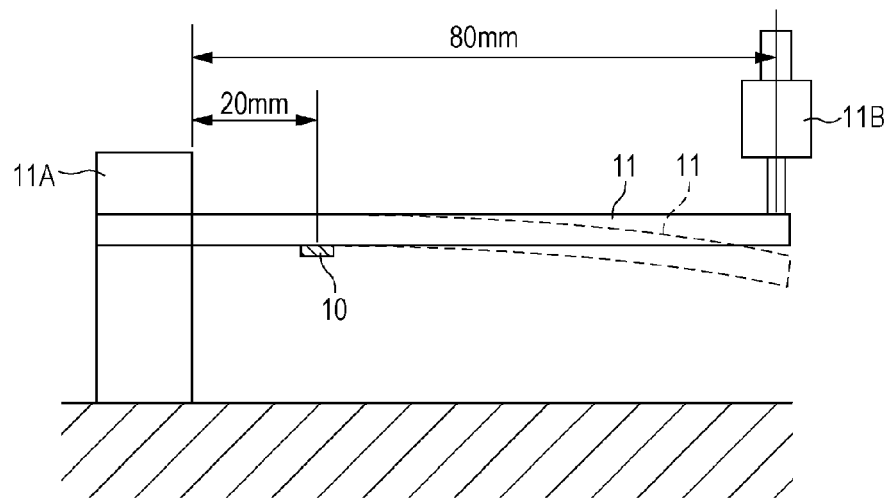
FIG. 4A is a front view illustrating an experimentation method.
Figure 4B:
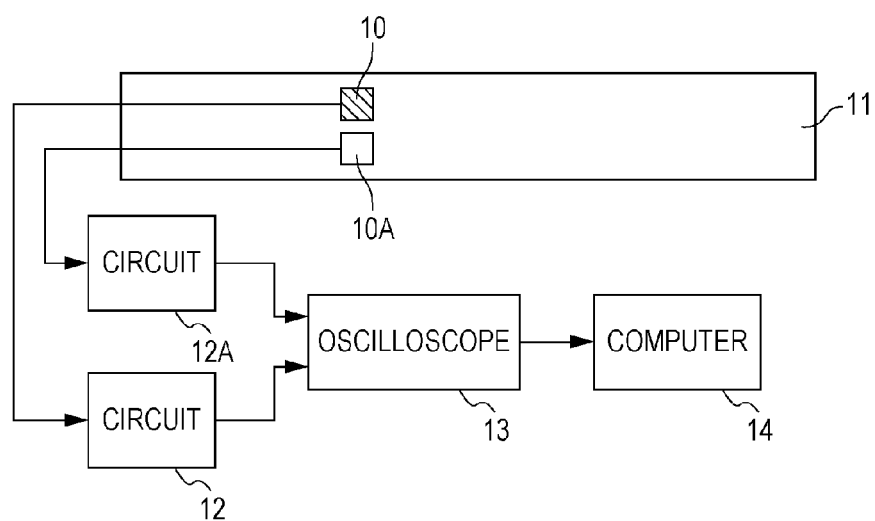
FIG. 4B is a bottom view illustrating the experimentation method.
Figure 5:
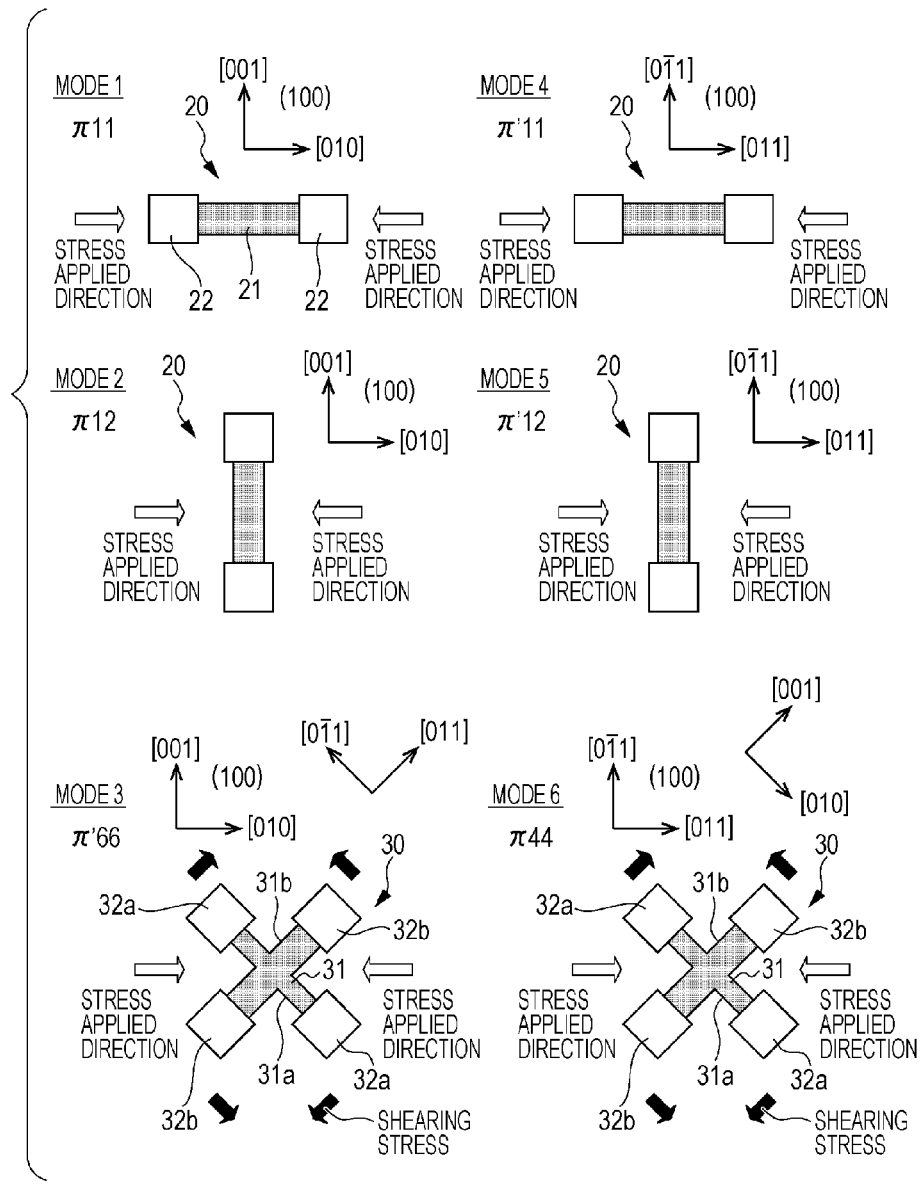
FIG. 5 is a diagram illustrating configurations and disposed directions of a single-crystal diamond piezoresistor.

With reference to FIGS. 4 to 6, the details of an experimentation method implemented to determine the crystal orientation dependency of the single-crystal diamond piezoresistor will be described. FIG. 4A is a front view illustrating the experimentation method. FIG. 4B is a bottom view illustrating the experimentation method.

[Experimentation Method]

1) As illustrated in FIGS. 4A and 4B, the diamond substrate 10 is affixed onto a tungsten cantilever 11 with adhesive agent so that the diamond substrate 10 with the single-crystal diamond piezoresistor formed thereon is positioned 20 mm from the fixed end. The cantilever 11 has a width of 15 mm and a thickness of 0.5 mm. Further, a diamond substrate 10A with the same shape and thickness as those of the diamond substrate 10 is similarly affixed at the same position (20 mm from the fixed end) adjacent to the diamond substrate 10 with the single-crystal diamond piezoresistor, using adhesive agent. On the diamond substrate 10A, a silicon strain gauge is affixed. In this way, it becomes possible to achieve a rigidity balance at the position of the cantilever 11 where the diamond substrates are affixed, and to measure an amount of strain in the diamond substrate 10A as a reference value by using the silicon strain gauge under the same environment that the diamond substrate 10 with the diamond piezoresistor formed thereon is under.

2) As illustrated in FIGS. 4A and 4B, the diamond piezoresistor (diamond substrate 10) and the silicon strain gauge (diamond substrate 10A) are connected to external circuits 12 and 12A, respectively, by wiring, such as Au wire or copper wire. One end of the cantilever 11 is fixed onto a fixing portion 11A, with the surface of the cantilever 11 on which the diamond substrate 10 with the single-crystal diamond piezoresistor is affixed facing downward.

3) The cantilever 11 is bent from the free end by using a micrometer 11B positioned 80 mm from the fixed end. As illustrated in FIG. 4A, to the lower face of the cantilever 11, compressive stress is applied in the longitudinal direction. The single-crystal diamond substrate is strongly secured with the adhesive agent. Thus, the compressive stress is equally applied to the single-crystal diamond piezoresistor and the silicon strain gauge.

4) Changes in resistance values of the single-crystal diamond piezoresistor and the silicon strain gauge caused by the compressive stress are output as voltages via the external circuits 12 and 12A. The output voltages are measured by an oscilloscope 13 (DL750 from Yokogawa Electric Corporation) and a computer 14. A piezoresistor with a pair of common input/output electrodes is a single resistor. Thus, an output can be obtained when the resistor is connected to a bridge circuit of the circuit 12. In a piezoresistor with two sets of electrode pairs, i.e., a pair of input electrodes and a pair of output electrodes, an output is obtained from the pair of output electrodes while a power supply voltage of 5 V is applied to the pair of input electrodes.

FIG. 5 illustrates configurations and disposed directions of the single-crystal diamond piezoresistor.

As illustrated in FIG. 5, a piezoresistor 20 with a pair of common input/output electrodes includes a single resistor 21. Common input/output electrodes 22, 22 are connected to the ends of the resistor 21.

A piezoresistor 30 with two sets of electrode pairs, i.e., a pair of input electrodes and a pair of output electrodes, includes a cross-shaped resistor 31. In the resistor 31, two mutually intersecting rectangles 31a and 31b are overlapping. Input electrodes 32a, 32a are connected to the ends of the rectangle 31a, while output electrodes 32b, 32b are connected to the ends of the rectangle 31b.

Modes 1 to 6 in FIG. 5 indicate methods of disposing the single-crystal diamond piezoresistor, respectively.

In mode 1 of FIG. 5, the single-crystal diamond piezoresistor 20 is disposed with the [010] direction aligned with the longitudinal direction of the cantilever 11, and with the pair of common input/output electrodes (common input/output electrodes 22, 22), which are opposed to each other at the ends of the single-crystal diamond piezoresistor 20, aligned with the [010] direction. Thus, the direction of application of stress to the single-crystal diamond piezoresistor 20 is aligned with the same direction ([010] direction) as the pair of common input/output electrodes (common input/output electrodes 22, 22).

In the present specification, the "direction of electrode pair" refers to the direction of a line segment connecting the positions or centers of the paired two electrodes.

In mode 2 of FIG. 5, the single-crystal diamond piezoresistor 20 is disposed with the [010] direction aligned with the longitudinal direction of the cantilever 11, and with the pair of common input/output electrodes (common input/output electrodes 22, 22), which are opposed to each other at the ends of the single-crystal diamond piezoresistor 20, aligned with the [001] direction. Thus, the direction of application of stress is a direction ([010] direction) perpendicular to the pair of common input/output electrodes.

In mode 3 of FIG. 5, the single-crystal diamond piezoresistor 30 is disposed with the [010] direction aligned with the longitudinal direction of the cantilever 11. In addition, the pair of input electrodes (input electrodes 32a, 32a) and the pair of output electrodes (output electrodes 32b, 32b) are disposed orthogonal to each other on the single-crystal diamond piezoresistor 30. Further, the pair of input electrodes opposed to each other (input electrodes 32a, 32a) is disposed in the [011] direction, and the direction of application of stress is aligned with the [010] direction. Thus, a state in which shearing stress can be equivalently applied is obtained.

In mode 1, a piezoresistance coefficient $\pi 11$ is determined. In mode 2, a piezoresistance coefficient $\pi 12$ is determined. In mode 3, $\pi'66 = \pi 11 - \pi 12$ is determined.

In mode 4 of FIG. 5, the single-crystal diamond piezoresistor 20 is disposed with the [011] direction aligned with the longitudinal direction of the cantilever 11, and with the pair of common input/output electrodes (common input/output electrodes 22, 22), which are opposed to each other at the ends of the single-crystal diamond piezoresistor 20, aligned with the [011] direction. Thus, the direction of application of stress to the single-crystal diamond piezoresistor 20 is aligned with the same direction ([011] direction) as that of the pair of common input/output electrodes (common input/output electrodes 22, 22).

In mode 5 of FIG. 5, the single-crystal diamond piezoresistor 20 is disposed with the [011] direction aligned with the longitudinal direction of the cantilever 11, and with the pair of common input/output electrodes (common input/output electrodes 22, 22), which are opposed to each other at the ends of the single-crystal diamond piezoresistor 20, aligned in the [0-11] direction. Thus, the direction of application of stress is aligned with a direction ([011] direction) perpendicular to the pair of common input/output electrodes (common input/output electrodes 22, 22).

In mode 6 of FIG. 5, the single-crystal diamond piezoresistor 30 is disposed with the [011] direction aligned with the longitudinal direction of the cantilever 11, and with the pair of input electrodes (input electrodes 32a, 32a) and the pair of output electrodes (output electrodes 32b, 32b) orthogonal to each other on the single-crystal diamond piezoresistor 30. Further, the pair of input electrodes opposed to each other (input electrodes 32a, 32a) is disposed in the [001] direction, with the direction of application of stress aligned with the [011] direction. Thus, a state in which shearing stress can be applied equivalently is obtained.

In mode 6, a piezoresistance coefficient $\pi 44$ is determined. In mode 4, $\pi'11 = \frac{1}{2}(\pi 11 + \pi 12 + \pi 44)$ is determined. In mode 5, $\pi'12 = \frac{1}{2}(\pi 11 + \pi 12 - \pi 44)$ is determined. Thus, by comparing the result of calculation based on modes 4 to 6 and the result of calculation based on modes 1 to 3, the number of digits in a numerical value and crystal orientation dependency can be confirmed.

FIGS. 6A and 6B illustrate dimensions of single-crystal diamond piezoresistors used in the experiment. The dimensions correspond to the dimensions of an area of the resistor 21 of the single-crystal diamond piezoresistor 20 or the resistor 31 of the single-crystal diamond piezoresistor 30 that substantially functions as a resistor.

Between a single-crystal diamond in which the gaseous phase concentration of boron during epitaxial growth is 4.5 ppm with respect to carbon and a single-crystal diamond in which the concentration is 5000 ppm, the impurity concentration in the piezoresistor greatly differs and the resistivity is greatly varied. Thus, as illustrated in FIG. 6A, the dimensions of the single-crystal diamond piezoresistor are varied depending on the gaseous phase concentration of boron. When the piezoresistance coefficient was derived, the Young's modulus of the single-crystal diamond in the <100> direction and <110> direction was 1050 GPa and 1150 GPa, respectively. The Poisson ratio of the single-crystal diamond in the <100> direction and <110> direction was 0.104 and 0.008, respectively.

Based on the experiment described above, the piezoresistance coefficients $\pi 11$, $\pi 12$, and $\pi 44$ when the major axis is in the <100> direction were determined. Further, crystal orientation dependency was also confirmed. The obtained results are shown below.

<Single-Crystal Diamond Piezoresistance Coefficients at Impurity Concentration of 4.5 ppm>
$\pi 11 = -0.33$, $\pi 12 = 0.20$, $\pi 44 = 7.60$ $[10^{-11}/Pa]$
(Resistivity $\rho = 13.23$ [ohm·cm])

<Single-Crystal Diamond Piezoresistance Coefficients at Impurity Concentration of 5000 ppm>
$\pi 11 = 0.18$, $\pi 12 = -0.04$, $\pi 44 = 3.63$ $[10^{-11}/Pa]$
(Resistivity $\rho = 0.00466$ [ohm·cm])

It should be noted that the value of $\pi 44$ is greater than $\pi 11$ and $\pi 12$ by an order of magnitude or more. For example, the single-crystal diamond piezoresistor is formed on the (100) plane of the diamond substrate. Then, the pair of common input/output electrodes opposed to each other at the ends of the single-crystal diamond piezoresistor are disposed in the [010] direction. Further, the direction of application of stress to the single-crystal diamond piezoresistor is aligned with, or made perpendicular to the pair of common input/output electrodes. In this case, the piezoresistance coefficients at the impurity concentration of 4.5 ppm are $\pi 11 = -0.33$ $[10^{-11}/Pa]$ and $\pi 12 = 0.20$ $[10^{-11}/Pa]$. Thus, the output is extremely small. On the other hand, the diamond piezoresistor is also formed on the (100) plane of the diamond substrate and disposed with the pair of common input/output electrodes, which are opposed to each other at the ends of the single-crystal diamond piezoresistor, aligned with the [011] direction. Further, the direction of application of stress to the single-crystal diamond piezoresistor is aligned with the pair of common input/output electrodes. In this case, the piezoresistance coefficients at the impurity concentration of 4.5 ppm are $\pi'11 = 3.735$ $[10^{-11}/Pa]$, and $\pi'12 = -3.865$ $[10^{-11}/Pa]$. Thus, the output can be increased by the crystal orientation dependency of the single-crystal diamond piezoresistor.

Based on the above results, it was discovered that the piezoresistance coefficients of the single-crystal diamond have crystal orientation dependency. The single-crystal diamond piezoresistors used in the experiment had a single-crystal diamond film homoepitaxially grown on a single-crystal diamond substrate. Similar crystal orientation dependency may be possessed by a hetero-epitaxial diamond deposited and grown so as to have a certain crystal orientation relationship with the substrate crystal.

<Force Detection Device Utilizing Crystal Orientation Dependency of Diamond Piezoresistor>

In the following, several examples of a force detection device utilizing the crystal orientation dependency of the diamond piezoresistor will be described.

Diamond is a cubical crystal. Thus, when rectangular coordinates are taken along a major axis, the relationship between the stress $\sigma_i$ and a change $\Delta\rho_i$ in specific resistance can be expressed by the piezoresistance coefficient $\pi_{ij}$ in the form of a predetermined matrix. FIG. 6C illustrates a matrix notation where the major axis is in the <100> direction.

Through coordinate transformation of the matrix related to the piezoresistance coefficient illustrated in FIG. 6C, it becomes possible to determine a piezoresistance coefficient on a certain plane with the major axis in a specific direction. Through such coordinate transformation, a graph of crystal orientation dependency of the piezoresistance coefficient on the certain plane is created. This allows for the selection of a piezoresistor with an orientation such that high sensitivity can be obtained, and with various arrangements and configurations. The piezoresistance coefficient on a certain plane with the major axis in a specific direction is denoted as $\pi'ij$ (i, j=1 to 6). For calculation formulae related to coordinate transformation, reference was made to "Review of Micromachine Technology", pp. 98-109, Sangyo Gijutsu Service Center, Jan. 22, 2003. In the following specific examples are indicated.

Figure 7:
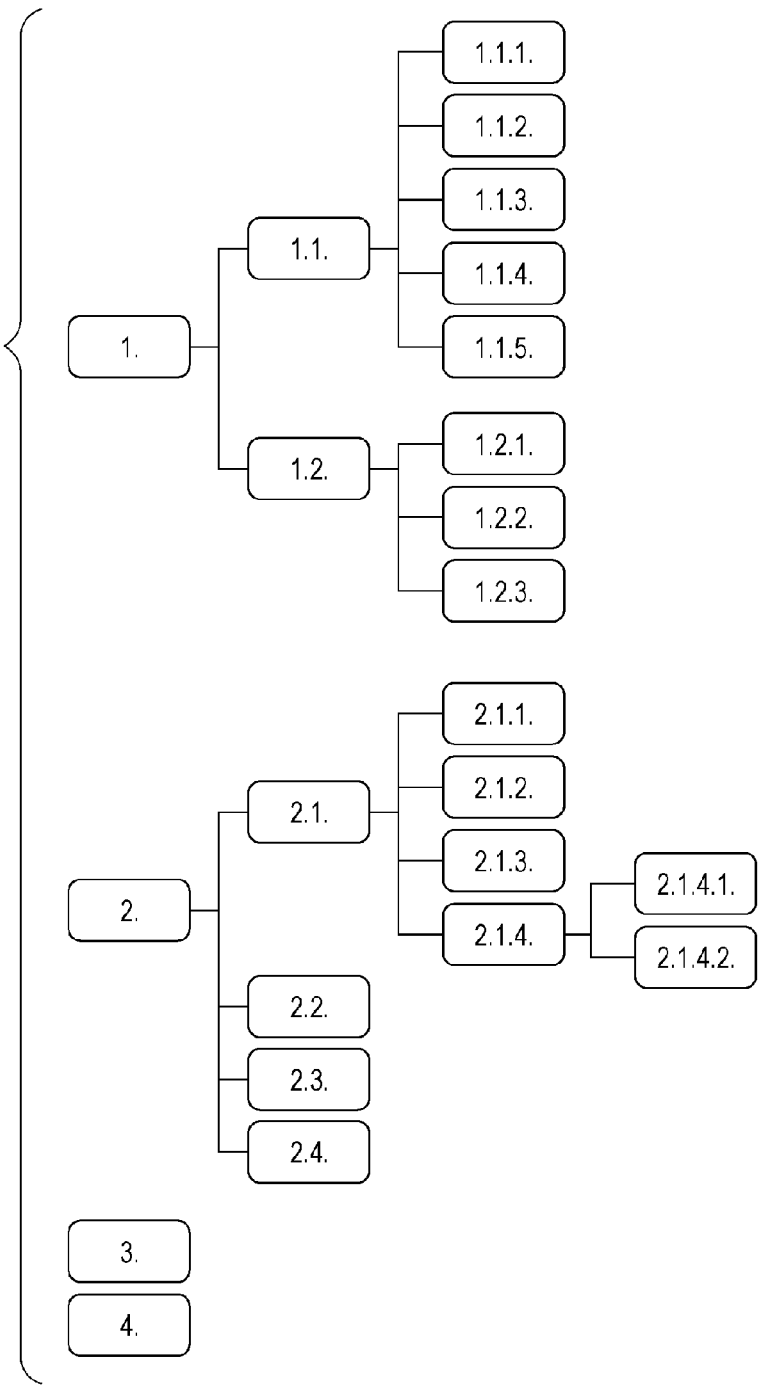
FIG. 7 is a diagram illustrating relationships among specific examples.

FIG. 7 illustrates relationships among the respective specific examples described below. The figure shows an overall picture of the disclosure by illustrating the specific examples, or configurations as generic concepts of the examples, in layers. The numbers (such as 1.1.1.) in FIG. 7 correspond to an individual specific example or the configuration as a generic concept of the example. The tree structure shown in FIG. 7 illustrates the relationship (generic concept or specific concept) between each specific example and each configuration. In the following, the individual specific examples and the configurations as the generic concepts of the examples will be described with reference to the numbers shown in FIG. 7.

<Configuration of Force Detection Device Based on In-Plane Stress>

1. π'11, π'12, π'66: (100)/(110)/(111)

Figure 8A:
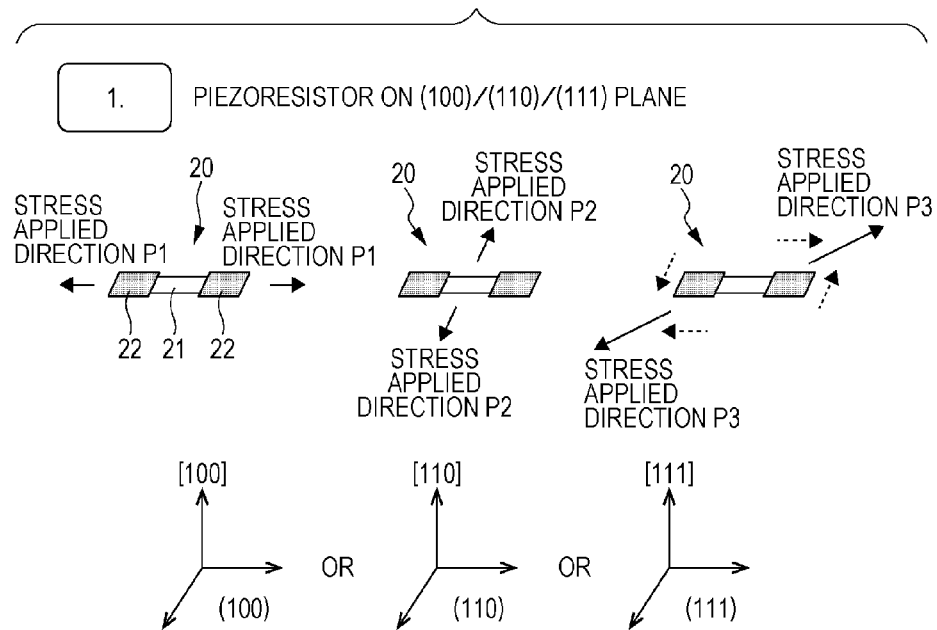
FIGS. 8A and 8B are diagrams illustrating structures of a force detection device based on in-plane perpendicular stress.

FIG. 8A illustrates force detection devices provided with the diamond piezoresistor including highly orientated diamond into which boron is introduced as an impurity. In these force detection devices, the diamond piezoresistor is formed on the (100) plane, the (110) plane, the (111) plane, or a crystal plane equivalent thereto of a diamond substrate. On the diamond piezoresistor, a pair of input electrodes opposed to each other (common input/output electrodes 22, 22) is disposed. In these force detection devices, the direction of application of stress to the diamond piezoresistor is aligned with a direction (P1) or perpendicular to a direction (P2) of the pair of input electrodes (common input/output electrodes 22, 22), or is a shearing direction (P3) thereof.

<Structure of Force Detection Device Based on In-Plane Perpendicular Stress>

1.1. π'11, π'12: (100)/(110)/(111)

Figure 8B:
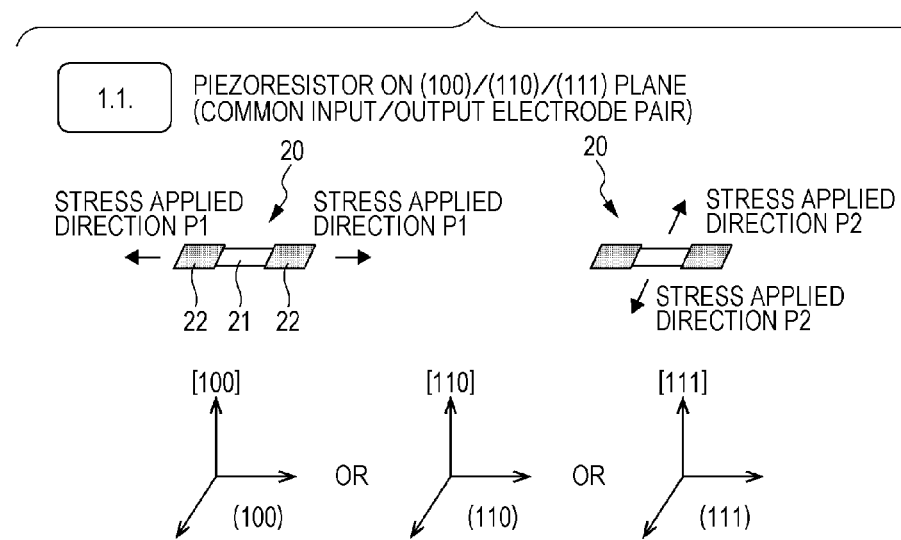

FIG. 8B illustrates force detection devices provided with the diamond piezoresistor including the highly orientated diamond into which boron is introduced as an impurity. In these force detection devices, the diamond piezoresistor is formed on the (100) plane, the (110) plane, the (111) plane, or a crystal plane equivalent thereto of a diamond substrate. A pair of common input/output electrodes (common input/output electrodes 22, 22) opposed to each other is disposed at the ends of the diamond piezoresistor. In these force detection devices, the direction of application of stress to the diamond piezoresistor is aligned with the direction (P1) or perpendicular to the direction (P2) of the pair of common input/output electrodes (common input/output electrodes 22, 22).

The configuration (1.1) utilizes the piezoresistive effect due to in-plane stress, and therefore can be readily applied to a strain gauge, a pressure sensor, an acceleration sensor, or a gyro sensor, for example.

<Specific Example of Force Detection Device Based on In-Plane Perpendicular Stress>

1.1.1. π'11, π'12: (100)

FIG. 9A illustrates force detection devices provided with the diamond piezoresistor including the highly orientated diamond into which boron is introduced as an impurity. In these force detection devices, the diamond piezoresistor is formed on the (100) plane or a crystal plane equivalent thereto of the diamond substrate. A pair of common input/output electrodes (common input/output electrodes 22, 22) opposed to each other at the ends of the diamond piezoresistor is disposed at an angle in the range of −15° to +15° relative to the [011] direction or a crystal direction equivalent thereto. In these force detection devices, the direction of application of stress to the diamond piezoresistor is aligned with or perpendicular to the pair of common input/output electrodes (common input/output electrodes 22, 22).

In order to utilize the crystal orientation dependency in the piezoresistance coefficients of the highly orientated diamond, a plane orientation in which the diamond piezoresistor is formed, a direction of the pair of common input/output electrodes and the direction of application of stress are determined.

When the plane orientation is determined to be the (100) plane or a crystal plane equivalent thereto, the pair of common input/output electrodes opposed to each other at the ends of the diamond piezoresistor is disposed in the [011] direction or a crystal direction equivalent thereto. The direction of application of stress to the diamond piezoresistor is aligned with or perpendicular to the pair of common input/output electrodes. In this way, the values of the piezoresistance coefficients are maximized.

From graphs 41 to 44 of the crystal orientation dependency of the piezoresistance coefficients shown in FIG. 9A, the following can be learned. In the (100) plane, when the direction of the pair of common input/output electrodes is in the angular range of −15° to +15° in the [011] direction, the piezoresistance coefficients are sufficiently large and have maximum values particularly in the [011] direction.

The graphs 41 and 42 shown in FIG. 9A indicate the relationship between the direction of the pair of common input/output electrodes and the piezoresistance coefficient π'11. The graph 41 indicates the relationship when the gaseous phase concentration of boron during epitaxial growth is 4.5 ppm. The graph 42 indicates the relationship when the concentration is 5000 ppm. The graphs 43 and 44 indicate the relationship between the direction of the pair of common input/output electrodes and the piezoresistance coefficient π'12. The graph 43 indicates the relationship when the gaseous phase concentration of boron during epitaxial growth is 4.5 ppm. The graph 44 indicates the relationship when the concentration is 5000 ppm. Similarly, the other graphs shown in the figures indicate the relationship between the direction of the electrode pair in a designated plane and a designated piezoresistance coefficient, together with the concentration.

1.1.2. π'11: (110)

FIG. 9B illustrates force detection devices provided with the diamond piezoresistor including the highly orientated diamond into which boron is introduced as an impurity. In these force detection devices, the diamond piezoresistor is formed on the (110) plane or a crystal plane equivalent thereto of the diamond substrate. The pair of common input/output electrodes (common input/output electrodes 22, 22) opposed to each other at the ends of the diamond piezoresistor is disposed at an angle in the range of −60° to +60° relative to the [−110] direction. In these force detection devices, the direction of application of stress to the diamond piezoresistor is aligned with the pair of common input/output electrodes (common input/output electrodes 22, 22).

From the graphs of the crystal orientation dependency of piezoresistance coefficient shown in FIG. 9B, the following can be learned. Namely, in the (110), when the direction of the pair pf common input/output electrodes is in the angular range of −60° to +60° relative to the [−110] direction, the piezoresistance coefficient is sufficiently large and has a maximum value particularly in the [−111] direction.

1.1.3. π'12: (110)

FIG. 9B illustrates force detection devices provided with the diamond piezoresistor including the highly orientated diamond into which boron is introduced as an impurity. In these force detection devices, the diamond piezoresistor is formed on the (110) plane or a crystal plane equivalent thereto of the diamond substrate. The pair of common input/output electrodes (common input/output electrodes 22, 22) opposed to each other at the ends of the diamond piezoresistor is disposed at an angle in the range of −15° to +15° relative to a direction displaced by 45° from the [−110] direction or a crystal direction equivalent thereto. In these force detection devices, the direction of application of stress to the diamond piezoresistor is perpendicular to the pair of common input/output electrodes (common input/output electrodes 22, 22).

From the graphs of the crystal orientation dependency of piezoresistance coefficient shown in FIG. 9B, the following can be learned. Namely, in the (110) plane, when the direction of the pair of common input/output electrodes is in the angular range of −15° to +15° in a direction displaced by 45° from the [−110] direction, the piezoresistance coefficient is sufficiently large and has a maximum value particularly in the direction displaced by 45° from the [−110] direction.

1.1.4. $\pi'11$, $\pi'12$: (111)

FIG. 10 illustrates force detection devices provided with the diamond piezoresistor including the highly orientated diamond into which boron is introduced as an impurity. In these force detection devices, the diamond piezoresistor is formed on the (111) plane or a crystal plane equivalent thereto of the diamond substrate. At the ends of the diamond piezoresistor, the pair of common input/output electrodes opposed to each other (common input/output electrodes 22, 22) is disposed. In these force detection devices, the direction of application of stress to the diamond piezoresistor is aligned with or perpendicular to the pair of common input/output electrodes (common input/output electrodes 22, 22).

From the graphs of the crystal orientation dependency of piezoresistance coefficient shown in FIG. 10, the following can be learned. Namely, the piezoresistance coefficients $\pi'11$ and $\pi'12$ in the (111) plane do not have direction dependency and take constant values. Thus, the piezoresistance coefficients $\pi'11$ and $\pi'12$ are constant even when the diamond piezoresistor has a directional error. Accordingly, individual differences can be minimized 1.1.5. $\pi'11$, $\pi'12$: Wheatstone Bridge in (100)/(110)/(111)

FIG. 11 illustrates a Wheatstone bridge (force detection device) including two sets of diamond piezoresistors opposed to each other. In the Wheatstone bridge, the direction of application of stress to one set of the diamond piezoresistors is aligned with the pair of common input/output electrodes. The direction of application of stress to the other set of the diamond piezoresistors is perpendicular to the pair of common input/output electrodes.

As illustrated in FIG. 11, the Wheatstone bridge is provided with diamond piezoresistors 20A, 20A and diamond piezoresistors 20B, 20B. Further, the Wheatstone bridge includes a wiring pattern PT1 connected to the diamond piezoresistors 20A, 20A and the diamond piezoresistors 20B, 20B, and terminals 50A, 50B, 50C, and 50D connected to the wiring pattern PT1. The diamond piezoresistors 20A, 20A are opposed to each other, and the diamond piezoresistors 20B, 20B are opposed to each other. In a diaphragm of the Wheatstone bridge, the direction of application of stress to the diamond piezoresistors 20A, 20A is aligned with the pair of common input/output electrodes (22A, 22A). Further, the direction of application of stress to the diamond piezoresistors 20B, 20B is perpendicular to the pair of common input/output electrodes (22B, 22B).

When the direction of application of stress to the diamond piezoresistors is aligned with the pair of common input/output electrodes, $\pi'11$ is applied. When the direction of application of stress to the diamond piezoresistors is perpendicular to the pair of common input/output electrodes, $\rho'12$ is applied. The piezoresistance coefficients $\pi'11$ and $\pi'12$ take mutually opposite signs. Thus, the output value of the Wheatstone bridge can be increased. Particularly, the Poisson ratio is minimized in the [011] direction in the (100) plane. Accordingly, a large output can be obtained.

When the plane orientation is determined to be the (100) plane or a crystal plane equivalent thereto, the pair of common input/output electrodes opposed to each other at the ends of one set of the diamond piezoresistors is disposed in the [011] direction or a crystal direction equivalent thereto, with the direction of application of stress aligned with the pair of common input/output electrodes. Further, the pair of common input/output electrodes opposed to each other at the ends of the other set of the diamond piezoresistors is disposed in the [011] direction or a crystal direction equivalent thereto, with the direction of application of stress perpendicular to the pair of common input/output electrodes. In this way, the output of the Wheatstone bridge has the maximum value. From the graphs of the crystal orientation dependency of the piezoresistance coefficients, the following can be learned. Namely, when, in the (100) plane, the direction of the pair of common input/output electrodes is in the angular range of −15° to +15° relative to the direction, the piezoresistance coefficients are sufficiently large and have maximum values particularly in the [011] direction.

When the plane orientation is determined to be the (110) plane or a crystal plane equivalent thereto, for example, the pair of common input/output electrodes opposed to each other at the ends of one set of the diamond piezoresistors is disposed in the [111] direction or in a crystal direction equivalent thereto, with the direction of application of stress aligned with the pair of common input/output electrodes. Further, the pair of common input/output electrodes opposed to each other at the ends of the other set of the diamond piezoresistors is disposed in a direction displaced by 45° from the [110] direction or a crystal direction equivalent thereto, with the direction of application of stress perpendicular to the pair of common input/output electrodes. Thus, the output from the Wheatstone bridge has the maximum value.

When the plane orientation is determined to be the (111) plane or a crystal plane equivalent thereto, the piezoresistance coefficients $\pi'11$ and $\pi'12$ in the (111) plane do not have direction dependency and instead take constant values. Thus, the direction of application of stress to one set of diamond piezoresistors is aligned with the pair of common input/output electrodes. Further, the direction of application of stress to the other set of diamond piezoresistors is made perpendicular to the pair of common input/output electrodes. The output from the Wheatstone bridge is not dependent on the direction of the pair of common input/output electrodes opposed to each other at the ends of the diamond piezoresistors.

<Structure of Force Detection Device Based on in-Plane Shearing Stress>

1.2. $\pi'66$: (100)/(110)/(111)

Figure 12:
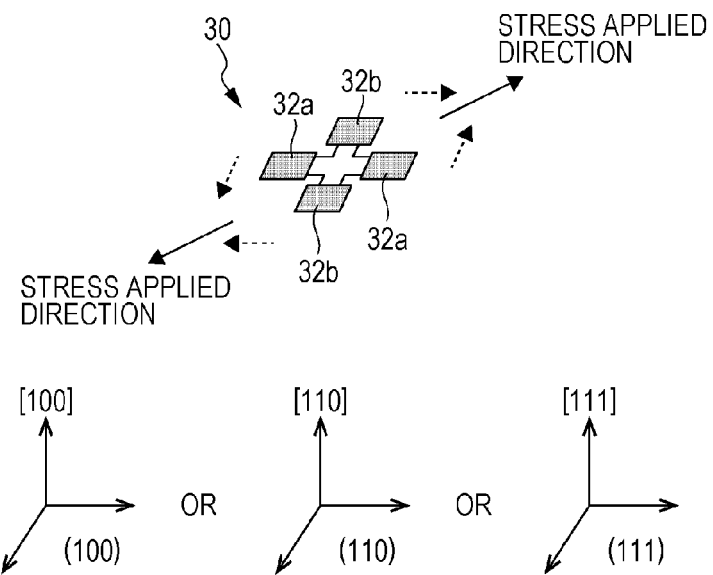
FIG. 12 is a diagram illustrating the structure of a force detection device based on in-plane shearing stress.

FIG. 12 illustrates a force detection device provided with the diamond piezoresistor including the highly orientated diamond into which boron is introduced as an impurity. In the force detection device, the diamond piezoresistor is formed on the (100) plane, the (110) plane, the (111) plane, or a crystal plane equivalent thereto of the diamond substrate. On the diamond piezoresistor, a pair of input electrodes opposed to each other and a pair of output electrodes opposed to each other are disposed orthogonal to each other. In the force detection device, the direction of application of stress to the diamond piezoresistor is a shearing direction with respect to the pair of input electrodes.

As illustrated in FIG. 12, in the diamond piezoresistor 30, the direction of the pair of input electrodes including the input electrodes 32a, 32a and the direction of the pair of output electrodes including the output electrodes 32b, 32b are orthogonal to each other. The direction of application of stress intersects the pair of input electrodes (such as at an angle of 45°).

In this configuration, the temperature dependency of resistance values can be cancelled, as according to the Wheatstone bridge, with a single resistor. Thus, the configuration enables a size reduction of the force detection device.

<Specific Examples of Force Detection Device Based on in-Plane Shearing Stress>

1.2.1. π'66: (100)

FIG. 13A illustrates a force detection device provided with the diamond piezoresistor including the highly orientated diamond into which boron is introduced as an impurity. In the force detection device, the diamond piezoresistor is formed on the (100) plane or a crystal plane equivalent thereto of the diamond substrate. On the diamond piezoresistor, a pair of input electrodes opposed to each other (input electrodes 32a, 32a) and a pair of output electrodes opposed to each other (output electrodes 32b, 32b) are disposed orthogonal to each other. Further, the pair of input electrodes opposed to each other (input electrodes 32a, 32a) is disposed at the angular range of −15° to +15° relative to the [010] direction or a crystal direction equivalent thereto. In the force detection device, the direction of application of stress to the diamond piezoresistor is a shearing direction with respect to the pair of input electrodes (input electrodes 32a, 32a).

When the plane orientation is determined to be the (100) plane or a crystal plane equivalent thereto, for example, on the diamond piezoresistor, the pair of input electrodes opposed to each other and the pair of output electrodes opposed to each other are disposed orthogonal to each other. Further, the pair of input electrodes opposed to each other is disposed in the [010] direction or a crystal direction equivalent thereto. The direction of application of stress to the diamond piezoresistor is a shearing direction with respect to the pair of input electrodes. Thus, the piezoresistance coefficient has the maximum value.

The piezoresistance coefficient π'66 in the (100) plane is greater than the piezoresistance coefficient π'66 in the (111) plane. Thus, the sensitivity of the force detection device can be increased.

From the graphs of the crystal orientation dependency of piezoresistance coefficient shown in FIG. 13A, the following can be learned. Namely, in the (100) plane, when the direction of the pair of input electrodes is in the angular range of −15° to +15° relative to the [010] direction, the piezoresistance coefficient is sufficiently large and has a maximum value particularly in the [010] direction.

1.2.2. π'66: (110)

FIG. 13B illustrates a force detection device provided with the diamond piezoresistor including the highly orientated diamond into which boron is introduced as an impurity. In the force detection device, the diamond piezoresistor is formed on the (110) plane or a crystal plane equivalent thereto of the diamond substrate. On the diamond piezoresistor, a pair of input electrodes opposed to each other (input electrodes 32a, 32a) and a pair of output electrodes opposed to each other (output electrodes 32b, 32b) are disposed orthogonal to each other. Further, the pair of input electrodes opposed to each other (input electrodes 32a, 32a) is disposed at the angular range of −15° to +15° relative to the [−110] direction, the [001] direction, or a crystal direction equivalent thereto. In the force detection device, the direction of application of stress to the diamond piezoresistors is a shearing direction with respect to the pair of input electrodes (input electrodes 32a, 32a).

The piezoresistance coefficient 11'66 in the (110) plane is greater than the piezoresistance coefficient 11'66 in the (111) plane. Thus, the sensitivity of the force detection device can be increased.

From the graphs of the crystal orientation dependency of the piezoresistance coefficients shown in FIG. 13B, the following can be learned. Namely, in the (110) plane, when the direction of the pair of input electrodes is in the angular range of −15° to +15° relative to the [001] direction or the [−110] direction, the piezoresistance coefficient is sufficiently large and has a maximum value particularly in the [001] direction or the [−110] direction.

1.2.3. π'66: (111)

Figure 14:
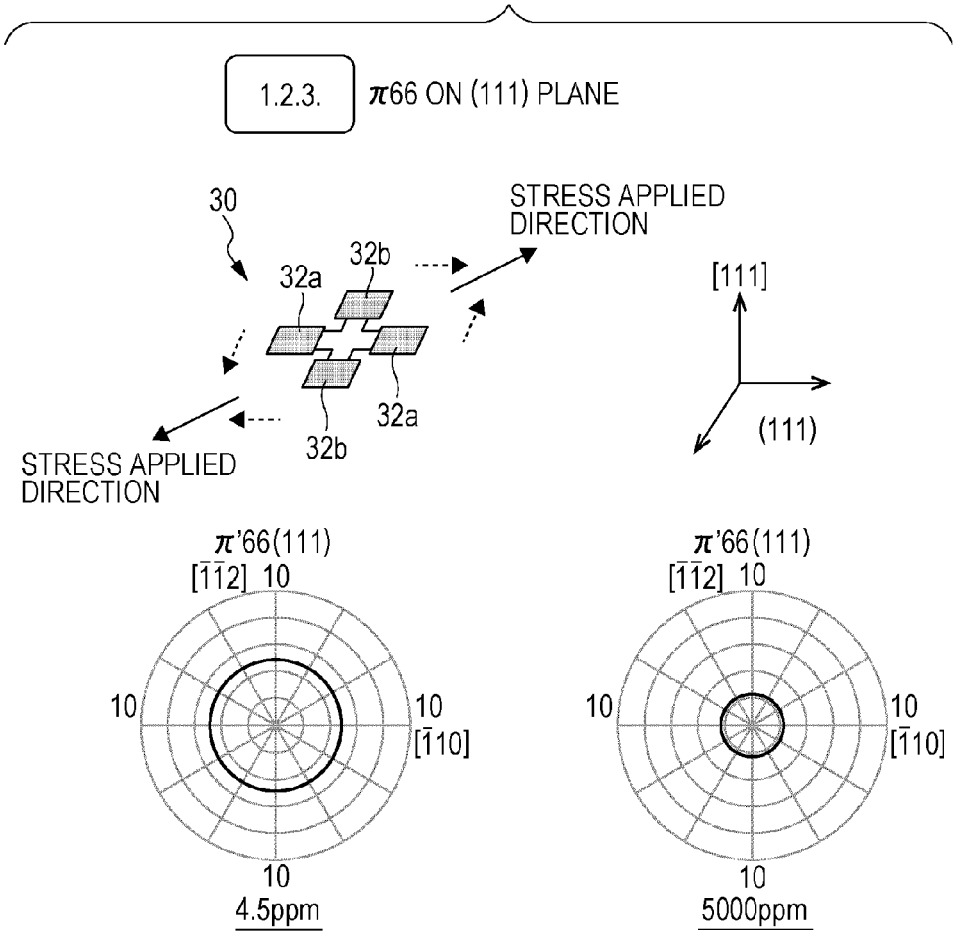
FIG. 14 is a diagram illustrating a specific example of the force detection device based on in-plane shearing stress.

FIG. 14 illustrates a force detection devices provided with the diamond piezoresistor including the highly orientated diamond into which boron is introduced as an impurity. In the force detection device, the diamond piezoresistor is formed on the (111) plane or a crystal plane equivalent thereto of the diamond substrate. On the diamond piezoresistor, a pair of input electrodes opposed to each other (input electrodes 32a, 32a) and a pair of output electrodes opposed to each other (output electrodes 32b, 32b) are disposed orthogonal to each other. In the force detection device, the direction of application of stress to the diamond piezoresistor is a shearing direction in the direction of the pair of input electrodes (input electrodes 32a, 32a).

From the graphs of the crystal orientation dependency of the piezoresistance coefficient shown in FIG. 14, the following can be learned. Namely, the piezoresistance coefficient π'66 in the (111) plane does not have direction dependency and takes a constant value. Thus, the piezoresistance coefficient π'66 is constant even when the diamond piezoresistor has a directional error. Accordingly, individual differences can be minimized.

<Structure of Force Detection Device Based on Out-of-Plane Stress>

2. π'13, π'63: (110)/(111)

FIG. 15A illustrates a force detection device provided with the diamond piezoresistor including the highly orientated diamond into which boron is introduced as an impurity. In the force detection device, the diamond piezoresistor is formed on the (110) plane, the (111) plane, or a crystal plane equivalent thereto of the diamond substrate. On the diamond piezoresistor, a pair of input electrodes opposed to each other (common input/output electrodes 22, 22) is disposed. The force detection device is characterized in that the plane of application of stress to the diamond piezoresistor is the (110) plane, the (111) plane, or a crystal plane equivalent thereto.

As illustrated in FIG. 15A, the diamond piezoresistor 20 is formed on the (110) plane, the (111) plane, or a crystal plane equivalent thereto of the diamond substrate. The plane of application of stress to the diamond piezoresistor 20 is the (110) plane, the (111) plane, or a crystal plane equivalent thereto. Namely, the direction P4 of application of stress is the [110] direction, the [111] direction, or a crystal direction equivalent thereto.

When the diamond piezoresistor is formed in the direction of the (100) plane or a crystal plane equivalent thereto of the diamond substrate, the values of the piezoresistance coefficients π'13 and π'63 are substantially zero. Thus, the (110) plane or the (111) plane is used.

<Specific Examples of Force Detection Device Based on Out-of-Plane Stress>

2.1. π'13: (110)/(111)

FIG. 15B illustrates a force detection device provided with the diamond piezoresistor including the highly orientated diamond into which boron is introduced as an impurity. In the force detection device, the diamond piezoresistor is formed on the (110) plane, the (111) plane, or a crystal plane equivalent thereto of the diamond substrate. At the ends of the diamond piezoresistor, a pair of common input/output electrodes opposed to each other (common input/output electrodes 22, 22) is disposed. In the force detection device, the plane of application of stress to the diamond piezoresistor is the (110) plane, the (111) plane, or a crystal plane equivalent thereto.

As illustrated in FIG. 15B, the diamond piezoresistor 20 is formed on the (110) plane, the (111) plane, or a crystal plane equivalent thereto of the diamond substrate. The plane of application of stress to the diamond piezoresistor 20 is the (110) plane, the (111) plane, or a crystal plane equivalent thereto. Namely, the direction P4 of application of stress is the [110] direction, the [111] direction, or a crystal direction equivalent thereto.

In the force detection device, compressive force acts perpendicularly on the face on which the diamond piezoresistor is formed. Diamond has a very high compressive strength of 9 GPa. Thus, the fact that the force detection device to which compressive stress is applied includes the diamond piezoresistor is most suitable from the viewpoint of strength, durability, and stability. When the diamond piezoresistor according to the present configuration is formed on the (100) plane of the diamond substrate, the piezoresistance coefficient becomes zero. Thus, the (110) plane or the (111) plane is used.

2.1.1. π'13: (110)

FIG. 16A illustrates a force detection device provided with the diamond piezoresistor including the highly orientated diamond into which boron is introduced as an impurity. In the force detection device, the diamond piezoresistor is formed on the (110) plane or a crystal plane equivalent thereto of the diamond substrate. A pair of common input/output electrodes (common input/output electrodes 22, 22) opposed to each other at the ends of the diamond piezoresistor is disposed at an angle in the range of −30° to +30° relative to the [110] direction or a crystal direction equivalent thereto. In the force detection device, the plane of application of stress to the diamond piezoresistor is the (110) plane or a crystal plane equivalent thereto.

The piezoresistance coefficient π'13 in the (110) plane is greater than the piezoresistance coefficient π'13 in the (111) plane. Thus, the sensitivity of the force detection device can be increased.

From the graphs of the crystal orientation dependency of the piezoresistance coefficient shown in FIG. 16A, the following can be learned. Namely, in the (110) plane, when the direction of the pair of common input/output electrodes is in the angular range of −30° to +30° relative to the [110] direction, the piezoresistance coefficient is sufficiently large and has a maximum value particularly in the [110] direction.

2.1.2. π'13: (111)

FIG. 16B illustrates a force detection device provided with the diamond piezoresistor including the highly orientated diamond into which boron is introduced as an impurity. In the force detection device, the diamond piezoresistor is formed on the (111) plane or a crystal plane equivalent thereto of the diamond substrate. At the ends of the diamond piezoresistor, a pair of common input/output electrodes opposed to each other (common input/output electrodes 22, 22) is disposed. In the force detection device, the plane of application of stress to the diamond piezoresistor is the (111) plane or a crystal plane equivalent thereto.

From the graphs of the crystal orientation dependency of the piezoresistance coefficient shown in FIG. 16B, the following can be learned. Namely, the piezoresistance coefficient π'13 in the (111) plane does not have direction dependency and instead takes a constant value. Thus, the piezoresistance coefficient π'13 is constant even when the diamond piezoresistor has a directional error. Thus, individual differences can be minimized.

2.1.3. π'13: Wheatstone Bridge in (110) <1> (Compressive Force Acting on Two Sets)

Figure 17:
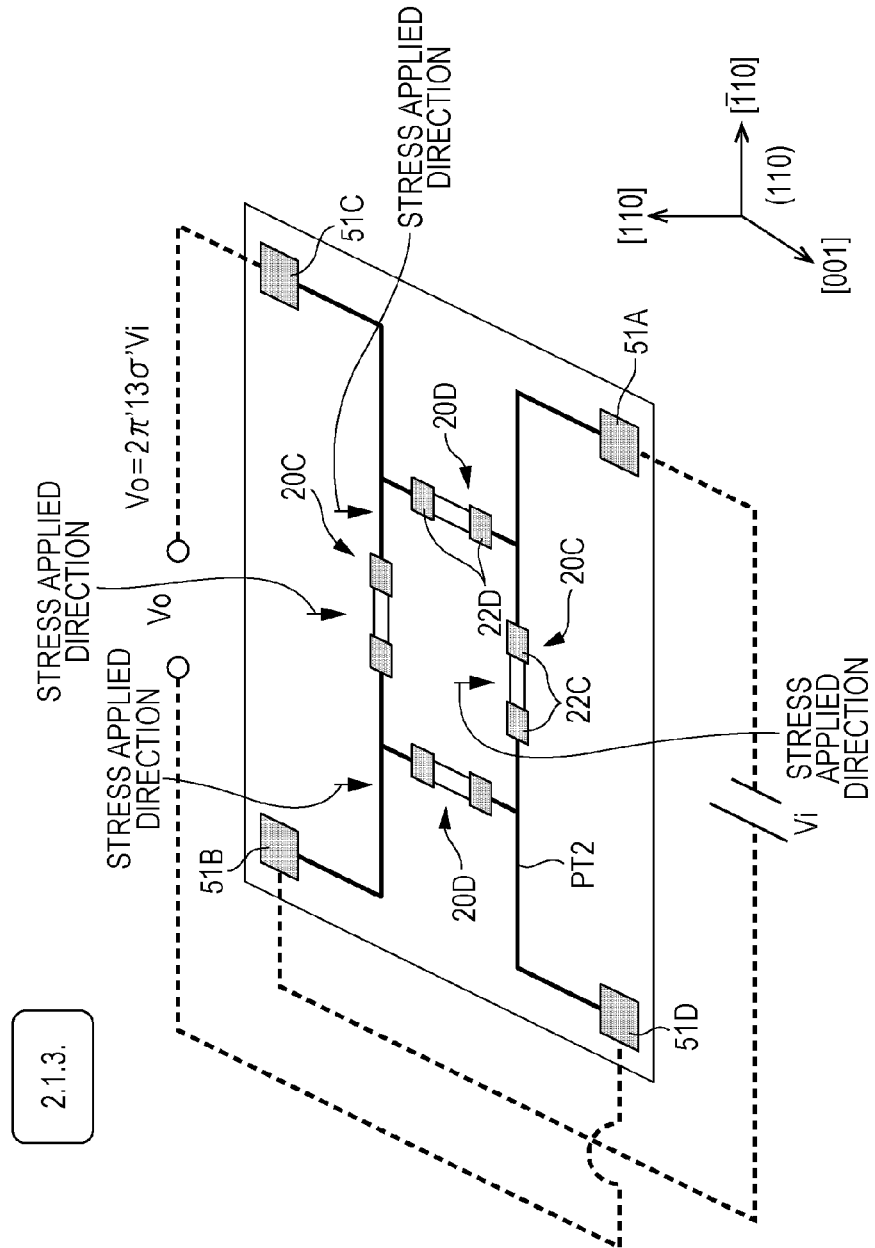
FIG. 17 is a perspective view illustrating a configuration of a Wheatstone bridge.

FIG. 17 illustrates a Wheatstone bridge. The Wheatstone bridge includes two sets of diamond piezoresistors opposed to each other. The diamond piezoresistors are formed on the (110) plane or a crystal plane equivalent thereto of the diamond substrate. The pair of common input/output electrodes opposed to each other at the ends of one set of the diamond piezoresistors is disposed at an angle in the range of −30° to +30° relative to the [110] direction or a crystal direction equivalent thereto. The pair of common input/output electrodes opposed to each other at the ends of the other set of the diamond piezoresistors is disposed at an angle in the range of −30° to +30° relative to the [001] direction or a crystal direction equivalent thereto.

In the Wheatstone bridge illustrated in FIG. 17, diamond piezoresistors 20C, 20C and diamond piezoresistors 20D, 20D are formed on the (110) plane of the diamond substrate. The Wheatstone bridge is provided with the diamond piezoresistors 20C, 20C, and the diamond piezoresistors 20D, 20D. Further, the Wheatstone bridge includes a wiring pattern PT2 connected to the diamond piezoresistors 20C, 20C and the diamond piezoresistors 20D, 20D, and terminals 51A, 51B, 51C, and 50D connected to the wiring pattern PT2.

The diamond piezoresistors 20C, 20C are opposed to each other. The diamond piezoresistors 20D, 20D are opposed to each other. A pair of common input/output electrodes (common input/output electrodes 22C, 22C) of the diamond piezoresistors 20C, 20C is disposed at an angle in the range of −30° to +30° relative to the [−110] direction. A pair of common input/output electrodes (common input/output electrodes 22D, 22D) of the diamond piezoresistors 20D, 20D is disposed at an angle in the range of −30° to +30° relative to the [001] direction.

The pair of common input/output electrodes opposed to each other at the ends of the other set of the diamond piezoresistors is disposed in the [001] direction or a crystal direction equivalent thereto. In this way, hardly any resistance change is caused by compressive force. Thus, compared with when a single diamond piezoresistor is used, the output from the Wheatstone bridge can be increased. Further, the temperature dependency of resistance values can be cancelled.

From the graphs of the crystal orientation dependency of the piezoresistance coefficient shown in FIG. 16A, the following can be learned. Namely, in the (110) plane, when the direction of the pair of common input/output electrodes (common input/output electrodes 22C, 22C) is in the angular range of −30° to +30° relative to the [−110] direction, the piezoresistance coefficient is sufficiently large and has a maximum value particularly in the [−110] direction. Further, in the (110) plane, when the direction of the pair of common input/output electrodes (common input/output electrodes 22D, 22D) is in the angular range of −30° to +30° in the [001] direction, the piezoresistance coefficient is sufficiently small and has a minimum value particularly in the [001] direction.

2.1.4. π'13: Wheatstone Bridge in (110)/(111) (Compressive Force Acting on Only One Set)

The Wheatstone bridge illustrated in FIG. 17 may include two sets of diamond piezoresistors opposed to each other. Stress may be applied to only one set of diamond piezoresistors.

In this case, compressive force acts on one set of the diamond piezoresistors. Thus, hardly any resistance change is caused in the other set of the diamond piezoresistors by compressive force. Accordingly, compared with when a single diamond piezoresistor is used, the output from the Wheatstone bridge can be increased. Further, the temperature dependency of resistance values can be cancelled.

The block face of the diamond piezoresistors on which compressive force acts may have a step such that stress is applied to only one set of the diamond piezoresistors. As will be described below in 2.1.4.2., the thickness of one set of diamond piezoresistors on which compressive force acts may be increased.

2.1.4.1. π'13: Wheatstone Bridge in (110)<2>

Figure 18:
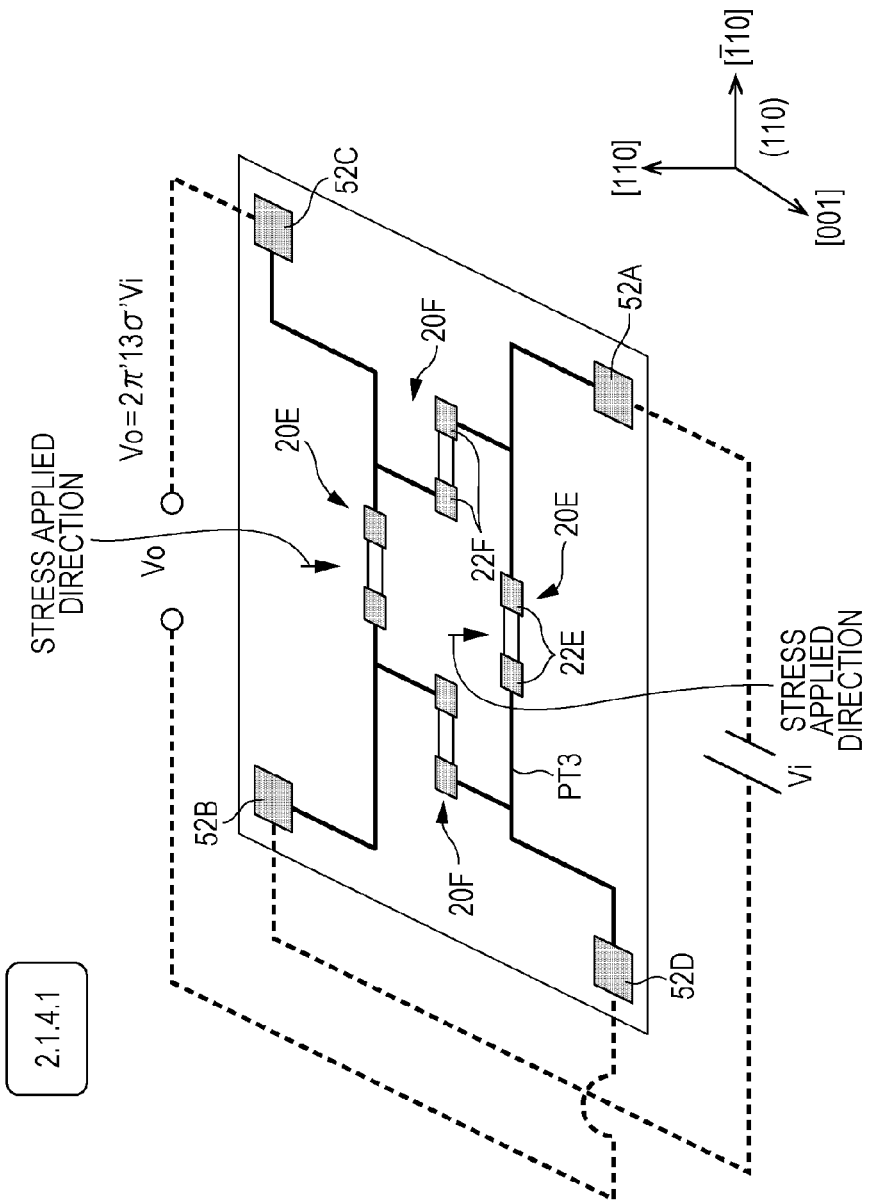
FIG. 18 is a perspective view illustrating a configuration of a Wheatstone bridge.

FIG. 18 illustrates a Wheatstone bridge (force detection device) that includes two sets of diamond piezoresistors opposed to each other. Stress is applied to only one set of diamond piezoresistors. The pair of common input/output electrodes opposed to each other at the ends of one set of the diamond piezoresistors is disposed in the [−110] direction or a crystal direction equivalent thereto.

As illustrated in FIG. 18, in the Wheatstone bridge, diamond piezoresistors 20E, 20E and diamond piezoresistors 20F, 20F are formed on the (110) plane of the diamond substrate. The Wheatstone bridge is provided with the diamond piezoresistors 20E, 20E and the diamond piezoresistors 20F, 20F. Further, the Wheatstone bridge includes a wiring pattern PT3 connected to the diamond piezoresistors 20E, 20E and the diamond piezoresistors 20F, 20F, and terminals 52A, 52B, 52C, and 52D connected to the wiring pattern PT3.

The diamond piezoresistors 20E, 20E are opposed to each other. The diamond piezoresistors 20F, 20F are opposed to each other. Pairs of common input/output electrodes (common input/output electrodes 22E, 22E) of the diamond piezoresistors 20E, 20E are disposed at an angle in the range of −30° to +30° relative to the [−110] direction.

As illustrated in FIG. 18, compressive force is caused to act on the diamond piezoresistors 20E, 20E, for example, while no compressive force is caused to act on the diamond piezoresistors 20F, 20F.

2.1.4.2. π'13: Wheatstone Bridge in (111)

Figure 19:
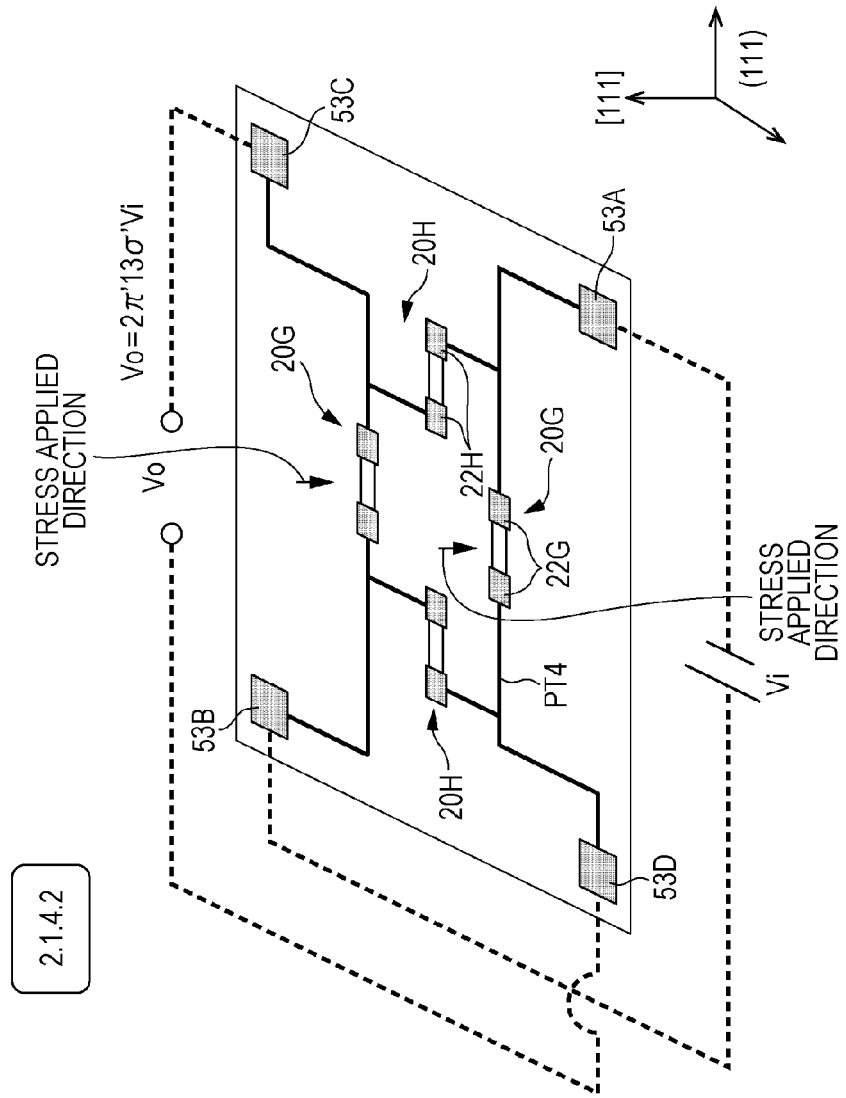
FIG. 19 is a perspective view illustrating a configuration of a Wheatstone bridge.

FIG. 19 illustrates a Wheatstone bridge (force detection device) that includes two sets of diamond piezoresistors opposed to each other. One set of the diamond piezoresistors has a thickness greater than a thickness of the other set of the diamond piezoresistors. Stress is applied to only one set of the diamond piezoresistors with the greater thickness.

In the Wheatstone bridge illustrated in FIG. 19, on the (111) plane of the diamond substrate, diamond piezoresistors 20G, 20G and diamond piezoresistors 20H, 20H are formed. The Wheatstone bridge is provided with the diamond piezoresistors 20G, 20G and the diamond piezoresistors 20H, 20H. Further, the Wheatstone bridge includes a wiring pattern PT4 connected to the diamond piezoresistors 20G, 20G and the diamond piezoresistors 20H, 20H, and terminals 53A, 53B, 53C, and 53D connected to the wiring pattern PT4.

From the graphs of the crystal orientation dependency of the piezoresistance coefficient shown in FIG. 16B, the following can be learned. Namely, the piezoresistance coefficient π'13 in the (111) plane does not have direction dependency and instead takes a constant value. Thus, the piezoresistance coefficient π'13 is constant even when the diamond piezoresistor has a directional error. Accordingly, individual differences can be minimized.

One set of the diamond piezoresistors 20G, 20G has a greater thickness than the thickness of the other set of the diamond piezoresistors 20H, 20H. In this way, compressive force acts on the one set of the diamond piezoresistors 20G, 20G. Thus, hardly any resistance change is caused in the other set of the diamond piezoresistors 20H, 20H by compressive force. Accordingly, compared with when a single diamond piezoresistor is used, the output from the Wheatstone bridge can be increased. Further, the temperature dependency of resistance values can be cancelled.

2.2. π'63: (110)

FIG. 20 illustrates the force detection device provided with the diamond piezoresistor including the highly orientated diamond into which boron is introduced as an impurity. In the force detection device, the diamond piezoresistor 30 is formed on the (110) plane or a crystal plane equivalent thereto of the diamond substrate. On the diamond piezoresistor, a pair of input electrodes opposed to each other (input electrodes 32a, 32a) and a pair of output electrodes opposed to each other (output electrodes 32b, 32b) are disposed orthogonal to each other. Further, the pair of input electrodes opposed to each other (input electrodes 32a, 32a) is disposed at an angle in the range of −15° to +15° relative to a direction displaced by 45° from the [−110] direction or a crystal direction equivalent thereto. The plane of application of stress to the diamond piezoresistor is the (110) plane or a crystal plane equivalent thereto.

In the force detection device, the temperature dependency of resistance values can be cancelled by a single resistor as according to a Wheatstone bridge. Thus, the size of the force detection device can be further reduced.

From the graphs of the crystal orientation dependency of the piezoresistance coefficient shown in FIG. 20, the following can be learned. Namely, in the (110) plane, when the direction of the pair of input electrodes is in the angular range of −15° to +15° relative to the direction displaced by 45° from the [−110] direction, the piezoresistance coefficient is sufficiently large and has a maximum value particularly in the direction displaced by 45° from the [−110] direction.

2.3. π'13, π'63: Application of Stress Via a Buffer Block in (110)/(111)

Figure 21A:
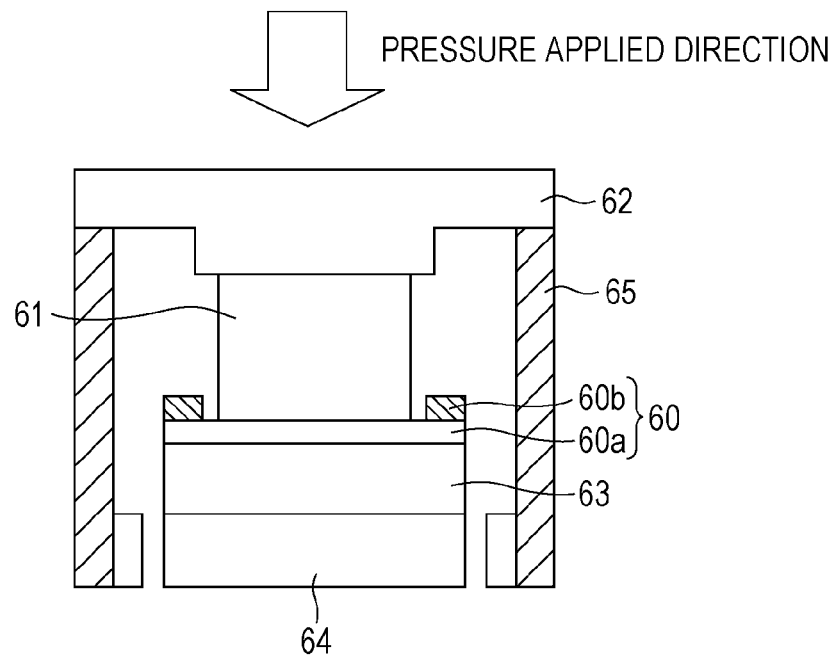
FIGS. 21A and 21B are cross sectional views of force transducer devices provided with a buffer block.

FIG. 21A illustrates a force transducer device. The force transducer device is provided with the present force detection device including a diamond piezoresistor 60, a buffer block 61, and a pressure-receiving substrate 62. The diamond piezoresistor 60 includes the highly orientated diamond into which boron is introduced as an impurity. The buffer block 61 is bonded to a stress applied face of the diamond piezoresistor 60. The pressure-receiving substrate 62 is bonded to the opposite face of the buffer block 61 from the face on which the diamond piezoresistor 60 is bonded. The pressure-receiving substrate 62 applies compressive force to the buffer block 61. The buffer block 61 has a coefficient of thermal expansion smaller than a coefficient of thermal expansion of the pressure-receiving substrate 62.

The diamond piezoresistor 60 is the diamond piezoresistor included in the force detection device described under the heading "2. π'13, π'63: (110)/(111)". The diamond piezoresistor 60 is formed on a substrate 63. The diamond piezoresistor 60 is provided with a resistor 60a, and electrodes 60b, 60b connected to both ends of the resistor 60a. The substrate 63 is fixed via a fixing plate 64. An outer peripheral portion of the pressure-receiving substrate 62 and an outer peripheral portion of the fixing plate 64 are coupled to a support base 65.

Stress may be applied to the diamond piezoresistor by various methods, such as a method by which compressive force is applied directly from the pressure-receiving substrate that receives pressure from the outside, and a method by which compressive force is applied via the block (buffer block 61). In the former, structural restrictions are produced.

Further, the force detection device is directly subjected to the influence of thermal strain caused by a difference in coefficients of thermal expansion of the pressure-receiving substrate and the diamond piezoresistor. In the latter, structural restrictions are less and the influence of thermal strain is smaller. Further, by making the coefficient of thermal expansion of the buffer block smaller than the coefficient of thermal expansion of the pressure-receiving substrate, the thermal strain applied to the diamond piezoresistor from the pressure-receiving substrate can be mitigated.

Particularly, by using diamond in the buffer block 61, the influence of thermal expansion on the diamond piezoresistor 60 can be minimized. When other materials are used for the buffer block 61, the compressive stress that can be applied to the diamond piezoresistor 60 may be limited by the compressive strength of the buffer block 61. When diamond is used as the material of the buffer block 61, the compressive stress that can be applied to the diamond piezoresistor 60 is not limited by the buffer block 61. Thus, the performance of the diamond piezoresistor 60 can be put into practical use with the maximum effect.

2.4. $\pi'13, \pi'63$: Corrosion-Resistant Pressure-Receiving Substrate Integral Structure in (110)/(111)

Figure 21B:
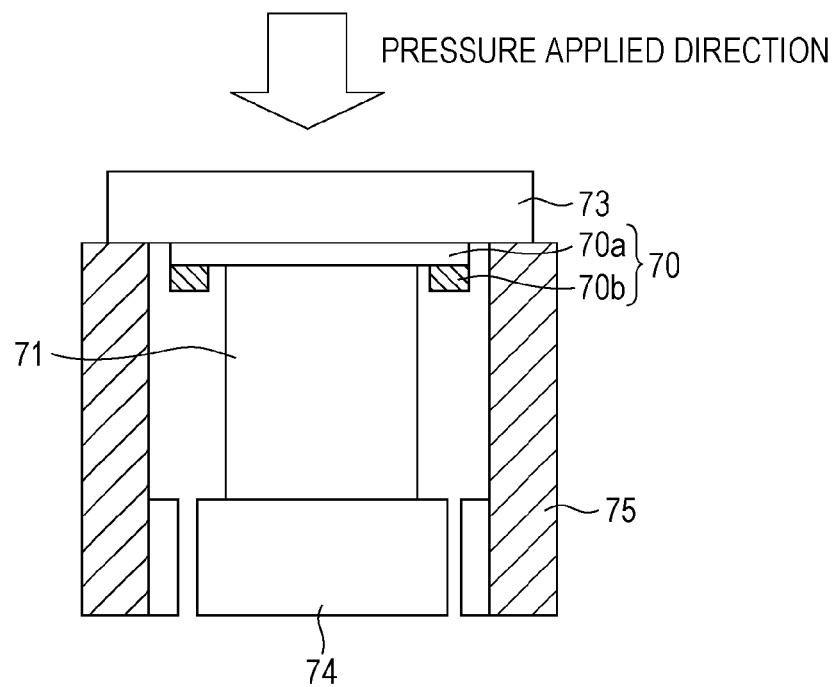

FIG. 21B illustrates a force transducer device. The force transducer device is provided with the present force detection device including a diamond piezoresistor 70, a buffer block 71, and a single-crystal diamond pressure-receiving substrate 73. The buffer block 71 is bonded to the stress applied face of the diamond piezoresistor 70. The diamond piezoresistor 70 is formed on a surface of the single-crystal diamond pressure-receiving substrate 73. When compressive force is applied from a rear surface of the single-crystal diamond pressure-receiving substrate 73, compressive force is received by the diamond piezoresistor 70 from the buffer block 71.

The diamond piezoresistor 70 is the diamond piezoresistor included in the force detection device described above under the heading "2. $\pi'13, \pi'63$: (110)/(111)". The diamond piezoresistor 70 is formed on the single-crystal diamond pressure-receiving substrate 73. The diamond piezoresistor 70 is provided with a resistor 70a, and electrodes 70b, 70b connected to both ends of the resistor 70a. The buffer block 71 is fixed by a fixing plate 74 on a face (lower surface in FIG. 21B) opposite to the face abutting on the single-crystal diamond pressure-receiving substrate 73. An outer peripheral portion of the single-crystal diamond pressure-receiving substrate 73 and an outer peripheral portion of the fixing plate 74 are coupled to a support base 75.

The buffer block 71 may be similar to the buffer block 61 and can provide a similar effect.

In the force transducer device illustrated in FIG. 21B, the single-crystal diamond pressure-receiving substrate 73 can be used as a wetted surface or an aeration surface. In this way, corrosion resistance can be significantly increased. When a diaphragm is used, the thickness of the diaphragm is precisely controlled so as to decrease individual differences in the amount of deflection. By using the pressure-receiving substrate, the need for precisely controlling the thickness can be eliminated.

3. Types of Highly Orientated Diamond

The orientation indicates the degree of alignment of crystal axes. A highly orientated diamond refers to a diamond with a high degree of crystal axis alignment. For example, the single-crystal diamond film formed by homoepitaxial growth on the single-crystal diamond substrate used in the embodiment has high orientation, high crystallinity, and low defect density. Such single-crystal diamond film has hardly any crystal grain boundary, and is therefore a suitable material for the force detection device according to the present disclosure. A hetero-epitaxial diamond deposited and grown so as to have a certain constant crystal orientation relationship with the substrate crystal, and other high orientation polycrystalline diamonds may also have similar crystal orientation dependency, and may also be applied to the force detection device according to the present disclosure. With regard to the hetero-epitaxial diamond, it is possible to grow, on a MgO substrate or a sapphire substrate, an epitaxial diamond with high crystallinity, using epitaxial Ir as an underlayer. Such hetero-epitaxial diamond may also have crystal orientation dependency. In the highly oriented diamond, the direction of growth of grown particles and the in-plane direction are oriented in the substrate. Thus, the highly orientated diamond may also have crystal orientation dependency.

4. Perpendicular Diamond Piezoresistor

FIGS. 22A to 22D illustrate a force detection device. In the force detection device, a high-concentration boron-doped epitaxial diamond, a low-concentration boron-doped epitaxial diamond, and a high-concentration boron-doped epitaxial diamond are laminated in that order in the planar direction.

Figure 22A:
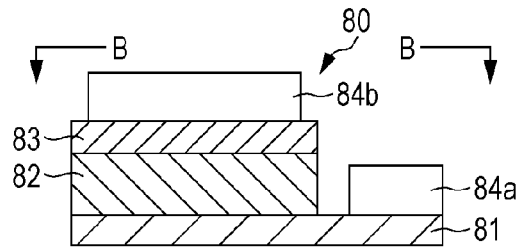
FIG. 22A is a cross sectional view of a vertical diamond piezo element.
Figure 22B:
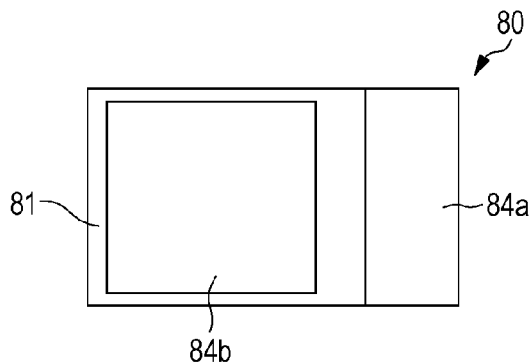
FIG. 22B is a plan view of the vertical diamond piezo element.

FIG. 22A is a cross sectional view of the force detection device. FIG. 22B is a plan view as viewed from a B-B line direction of FIG. 22A.

As illustrated in FIGS. 22A to 22D, a perpendicular diamond piezoresistor (diamond laminated body) 80 includes a diamond laminated body. In the diamond laminated body, a high-concentration boron-doped epitaxial diamond layer 81, a low-concentration boron-doped epitaxial diamond layer 82, and a high-concentration boron-doped epitaxial diamond layer 83 are laminated in that order in the planar direction (upper direction in FIG. 22A). Electrodes 84a and 84b include a Ti/Au layer. The electrode 84a is connected to the high-concentration boron-doped epitaxial diamond layer 81. The electrode 84b is connected to the high-concentration boron-doped epitaxial diamond layer 83.

Figure 22C:
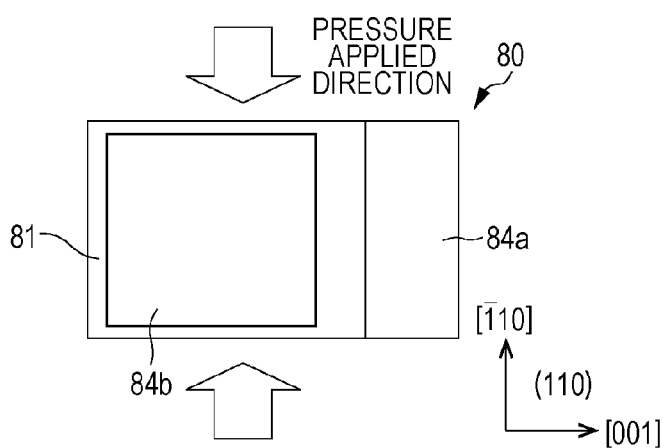
FIGS. 22C and 22D illustrate pressure applied directions.
Figure 22D:
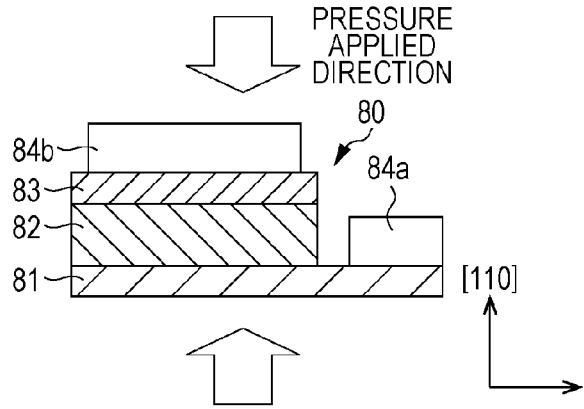

Thus, the resistor may have a vertical structure. In the vertical structure, the resistance of the piezoresistor can be decreased, and/or the influence of position error during the manufacturing process can be decreased. The piezoresistor is fabricated by laminating the high-concentration boron-doped diamond (HBDD) for contact resistance reduction and the low-concentration boron-doped diamond (LBDD) used as a piezoresistor. In the vertical structure, the crystallinity of the low-concentration boron-doped diamond is increased. Further, in order to decrease contact resistance, the high-concentration boron-doped diamond is formed as an underlayer. For example, as illustrated in FIG. 22C, the diamond piezoresistor is formed with the HBDD-LBDD-HBDD laminated structure on the (110) plane of the diamond substrate. When the direction of application of stress to the diamond piezoresistor is the [110] direction or a crystal direction equivalent thereto, the piezoresistance coefficient $\pi'12$ can be utilized. The diamond piezoresistor may be formed with the HBDD-LBDD-HBDD laminated structure on the (110) plane of the diamond substrate. When the plane of application of stress to the diamond piezoresistor is the (110) plane or a crystal plane equivalent thereto, the piezoresistance coefficient $\pi'11$ can be utilized.

Modified Examples

In the experiment (embodiment), two different gaseous phase concentrations (4.5 ppm and 5000 ppm) of boron with respect to carbon were used during epitaxial growth. However, the gaseous phase concentration of boron with respect to carbon during epitaxial growth may be varied, and an arbitrary concentration may be selected from a range on the order of from 0.01 ppm to 10%.

The method of synthesizing a single-crystal diamond film on the single-crystal diamond substrate is not particularly limited. For example, the single-crystal diamond film is synthesized by hot filament CVD process, microwave plasma CVD process, direct-current plasma CVD process, high-temperature, high-pressure synthesis, plasma arc jet process, or physical vapor deposition. An exemplary method for forming the single-crystal diamond film is a microwave plasma CVD process. The microwave plasma CVD process can suppress the entry of impurity such as metal, thus decreasing defects.

The development of defect during the synthesis of single-crystal diamond by vapor phase synthesis of diamond may be suppressed by the following methods (1) to (3).

(1) Trace amounts of an impurity component is added to material gas so as to cause a specific crystal plane to grow preferentially.

(2) Conditions that cause preferential orientation of a specific crystal plane are selected.

(3) A substrate with a surface having a minute inclination (off-angle) with respect to a crystal plane that can be epitaxially grown is prepared. On the substrate, diamond is grown by step-flow growth.

In the example, the diamond piezoresistor has plane orientations {100}, {110} or {111}. These plane orientations may be inclined with an off-angle on the order of 0 to 10°.

The dopant for providing the diamond film with electrical conductivity may be a p-type dopant or an n-type dopant. An example of p-type dopant is boron (B). Examples of n-type dopant include phosphorus (P), nitrogen (N), sulfur (S), arsenic (As), and antimony (Sb). Particularly, boron (B) enables high-concentration doping. Further, the acceptor level of boron (B) is small (0.37 eV) compared with other dopants.

Examples of the method for introducing impurity for providing the diamond film with electrical conductivity include a method by which a dopant gas is mixed together with material gas at the time of CVD synthesis, a method using thermal diffusion, and a method using ion injection.

As in 13) Ti/Au sputtering (FIG. 2) in "Diamond piezoresistor fabrication process" described above, a metal carbide may be formed, and, together with a metal film (Ti) for establishing ohmic contact with the single-crystal diamond piezoresistor, a metal protection film (Au) for protection of the metal film and for wire bonding may be formed. The material of the former metal film may include titanium (Ti), vanadium (V), chromium (Cr), molybdenum (Mo), tungsten (W), silicon carbide (SiC), tantalum (Ta), niobium (Nb), zirconium (Zr), titanium carbide (TiC), vanadium carbide (VC), chromium carbide ($Cr_3C_2$), molybdenum carbide ($Mo_2C$), tungsten carbide (WC), tantalum carbide (TaC), niobium carbide (NbC), and zirconium carbide (ZrC), either as a simple substance or an alloy. The material of the metal protection film may include nickel (Ni), copper (Cu), iron (Fe), cobalt (Co), gold (Au), platinum (Pt), and aluminum (Al), either as a simple substance or an alloy of. The protection film may include a multi-layer film containing the above metals.

In the diamond piezoresistor fabrication process described above, annealing is performed in a vacuum furnace ("19) Annealing" in FIG. 3). In this way, the contact resistance between the diamond piezoresistor and Ti can be decreased while their adhesion is increased. Between the diamond piezoresistor and Ti, a high-concentration boron-doped diamond layer may be introduced as a buffer layer.

Figure 23A:
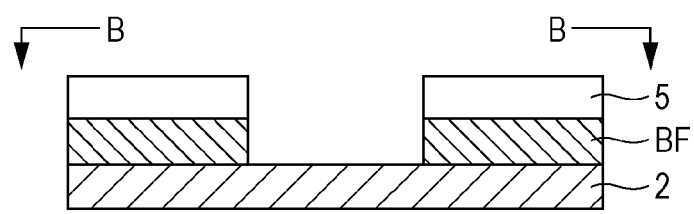
FIG. 23A is a cross sectional view of a configuration including a buffer layer.
Figure 23B:
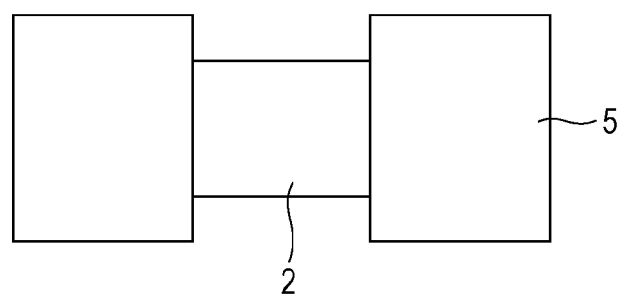
FIG. 23B is a plan view of the configuration.

FIG. 23A is a cross sectional view of the buffer layer. FIG. 23B is a cross sectional view taken along line B-B of FIG. 23A.

As illustrated in FIGS. 23A and 23B, the diamond piezoresistor includes the p-type single-crystal diamond film 2 and the Ti/Au film 5. Between the p-type single-crystal diamond film 2 and the Ti/Au film 5, a high-concentration boron-doped diamond layer is provided as a buffer layer BF. By thus introducing the buffer layer, the contact resistance between the metal wiring and the diamond piezoresistor can be decreased without performing annealing.

Instead of the annealing in the vacuum furnace, annealing may be performed in an inert gas environment. Examples of the inert gas include nitrogen ($N_2$) gas, argon (Ar) gas, and helium (He) gas. The anneal temperature is in the range of from 200° C. to 1200° C., for example, so that a carbide can be formed in the junction plane of the sputtered metal and diamond.

The diaphragm may have various shapes, such as quadrangular, circular, or elliptical shape.

With regard to the arrangement of the piezoresistors in the Wheatstone bridge, one set of the single-crystal diamond piezoresistors may be formed at the end of the diaphragm, while the other set of the single-crystal diamond piezoresistors may be formed in a region outside the diaphragm.

In another mode of arrangement, one set of the single-crystal diamond piezoresistors may be formed at the center of the diaphragm. The other set of the single-crystal diamond piezoresistors may be formed at the end of the diaphragm. When strain is caused in a compressive (tensile) direction at the center, strain in a tensile (compressive) direction is caused at the end. Thus, the output from the bridge circuit including the two sets of electrically conductive single-crystal diamond piezoresistors can be increased.

In a further embodiment, two diamond piezoresistors may be connected on the power supply side or ground terminal side in the Wheatstone bridge. For example, one single-crystal diamond piezoresistor is formed at the center of the diaphragm, and another single-crystal diamond piezoresistor is formed at the end of the diaphragm. The remaining two resistors may include metal thin-film resistors whose resistance value can be readily adjusted by a laser trimmer. When strain is caused in a compressive (tensile) direction at the center, strain in a tensile (compressive) direction is caused at the end. Thus, the output from the bridge circuit including the two sets of electrically conductive single-crystal diamond piezoresistors can be increased. Further, the offset voltage can be adjusted by the metal thin-film resistors.

According to the embodiment, the epitaxial diamond included in the diamond piezoresistors may include hetero-epitaxial diamond or highly orientated diamond. With regard to the hetero-epitaxial diamond, epitaxial diamond with high crystallinity can be grown on a MgO substrate or a sapphire substrate while using epitaxial Ir as an underlayer. Such hetero-epitaxial diamond may also have crystal orientation dependency. In the highly orientated diamond, the direction of growth of the grown particles and the in-plane direction are oriented in the substrate. Thus, the highly orientated diamond may also have crystal orientation dependency.

FIG. 24 shows examples of the "equivalent" directions and "equivalent" planes described in the present specification. The equivalent directions are collectively denoted by using angle brackets, as in <u v w>. The equivalent planes are collectively denoted by using curly brackets, as in {u v w}.

As described above, according to the present disclosure, a force detection device or force transducer device of various configurations that can be used stably under high temperature environment can be fabricated by utilizing the crystal orientation dependency of the highly orientated diamond piezoresistor, for example.

The range of application of the present disclosure is not limited to the embodiment. The present disclosure may be widely applied to the force detection device or a force transducer device provided with a diamond piezoresistor including the highly orientated diamond into which boron is introduced as an impurity.

With regard to FIG. 6B, when rectangular coordinates are taken along a major axis, since diamond is a cubical crystal, the stress $\sigma_i$ and the change $\Delta\rho_i$ in specific resistance can be related to each other by the piezoresistance coefficient $\pi_{ij}$ in the form of a predetermined matrix.

In the block face via which compressive force acts on the diamond piezoresistor, a step may be provided so as to enable stress to be applied to only one set of diamond piezoresistors. The thickness of one set of diamond piezoresistors on which compressive force is caused to act may be increased, as described in 2.1.4.2.

In addition, a device of the present disclosure may be first to twenty-third force detection devices or first and second force transducer devices as follows.

The first force detection device includes a diamond piezoresistor including a highly orientated diamond into which boron is introduced as an impurity. In the first force detection device, an absolute value of the piezoresistance coefficient of the diamond piezoresistor is greater than an absolute value of a piezoresistance coefficient $\pi 11$ or $\pi 12$ in a case in which a major axis is in a <100> direction.

The second force detection device according to the first force detection device further includes: a diamond substrate; and a pair of input electrodes opposed to each other on the diamond piezoresistor. In the second force detection device, the diamond piezoresistor is formed on a (100) plane, a (110) plane, a (111) plane, or a crystal plane equivalent thereto of the diamond substrate; and the diamond piezoresistor is subjected to a stress applied in a direction that is aligned with or perpendicular to the pair of input electrodes or is a shearing direction with respect to the pair of input electrodes.

In the third force detection device according to the second force detection device, the pair of input electrodes is a pair of common input/output electrodes opposed to each other at the ends of the diamond piezoresistor; and the direction of application of the stress to the diamond piezoresistor is aligned with or perpendicular to the pair of common input/output electrodes.

In the fourth force detection device according to the third force detection device, the diamond piezoresistor is formed on the (100) plane or a crystal plane equivalent thereto of the diamond substrate; and the pair of common input/output electrodes is disposed at an angle in the range of −15° to +15° relative to the [011] direction or a crystal direction equivalent thereto.

In the fifth force detection device according to the third force detection device, the diamond piezoresistor is formed on the (110) plane or a crystal plane equivalent thereto of the diamond substrate; the pair of common input/output electrodes is disposed at an angle in a range of −60° to +60° relative to the [110] direction or a crystal direction equivalent thereto; and the direction of application of the stress to the diamond piezoresistor is aligned with the pair of common input/output electrodes.

In the sixth force detection device according to the third force detection device, the diamond piezoresistor is formed on the (110) plane or a crystal plane equivalent thereto of the diamond substrate; the pair of common input/output electrodes is disposed at an angle in a range of −15° to +15° relative to a direction displaced by 45° from the [110] direction or a crystal direction equivalent thereto; and the direction of application of the stress to the diamond piezoresistor is perpendicular to the pair of common input/output electrodes.

In the seventh force detection device according to the third force detection device, the diamond piezoresistor is formed on the (111) plane or a crystal plane equivalent thereto of the diamond substrate.

The eighth force detection device according to the third force detection device includes a Wheatstone bridge including two sets of the diamond piezoresistors opposed to each other. In the eighth force detection device, the direction of application of the stress to one set of the diamond piezoresistors is aligned with the pair of common input/output electrodes; and the direction of application of the stress to the other set of the diamond piezoresistors is perpendicular to the pair of common input/output electrodes.

The ninth force detection device according to the second force detection device further includes a pair of output electrodes opposed to each other and disposed orthogonal to the pair of input electrodes. In the ninth the force detection device, the direction of application of the stress to the diamond piezoresistor is a shearing direction with respect to the pair of input electrodes.

In the tenth force detection device according to the ninth force detection device, the diamond piezoresistor is formed on the (100) plane or a crystal plane equivalent thereto of the diamond substrate; and the pair of input electrodes opposed to each other is disposed at an angle in a range of −15° to +15° relative to the [010] direction or a crystal direction equivalent thereto.

In the eleventh detection device according to the ninth force detection device, the diamond piezoresistor is formed on the (110) plane or a crystal plane equivalent thereto of the diamond substrate; and the pair of input electrodes opposed to each other is disposed at an angle in a range of −15° to +15° relative to the [110] direction, the [001] direction, or a crystal direction equivalent thereto.

In the twelfth force detection device according to the ninth force detection device, the diamond piezoresistor is formed on the (111) plane or a crystal plane equivalent thereto of the diamond substrate.

The thirteenth force detection device according to the first force detection device further includes: a diamond substrate; and a pair of input electrodes opposed to each other on the diamond piezoresistor. In the thirteenth force detection device, the diamond piezoresistor is formed on the (110) plane, the (111) plane, or a crystal plane equivalent thereto of the diamond substrate; and the diamond piezoresistor is subjected to a stress applied in a plane which is the (110) plane, the (111) plane, or a crystal plane equivalent thereto.

In the fourteenth force detection device according to the thirteenth force detection device, the pair of input electrodes is a pair of common input/output electrodes opposed to each other at the ends of the diamond piezoresistor.

In the fifteenth force detection device according to the fourteenth force detection device, the diamond piezoresistor is formed on the (110) plane or a crystal plane equivalent thereto of the diamond substrate; the pair of common input/output electrodes is disposed at an angle in a range of −30° to +30° relative to the [110] direction or a crystal direction equivalent thereto; and the plane of application of the stress to the diamond piezoresistor is the (110) plane or a crystal plane equivalent thereto.

In the sixteenth force detection device according to the fourteenth force detection device, the diamond piezoresistor is formed on the (111) plane or a crystal plane equivalent thereto of the diamond substrate; and the plane of application of the stress to the diamond piezoresistor is the (111) plane or a crystal plane equivalent thereto.

The seventeenth force detection device according to the fourteenth force detection device includes a Wheatstone bridge including two sets of the diamond piezoresistors opposed to each other. In the seventeenth force detection device, the diamond piezoresistor is formed on the (110) plane or a crystal plane equivalent thereto of the diamond substrate; the pair of common input/output electrodes opposed to each other at the ends of one set of the diamond piezoresistors is disposed at an angle in a range of −30° to +30° relative to the [110] direction or a crystal direction equivalent thereto; and the pair of common input/output electrodes opposed to each other at the ends of the other set of the diamond piezoresistors is disposed at an angle in a range of −30° to +30° relative to the [001] direction or a crystal direction equivalent thereto.

The eighteenth force detection device according to the fourteenth force detection device includes a Wheatstone bridge including two sets of the diamond piezoresistors opposed to each other. In the eighteenth force detection device, the stress is applied to only one set of the diamond piezoresistors.

In the nineteenth force detection device according to the eighteenth force detection device, the pair of common input/output electrodes opposed to each other at the ends of the one set of the diamond piezoresistors to which the stress is applied is disposed in the [110] direction or a crystal direction equivalent thereto.

In the twentieth force detection device according to the eighteenth force detection device, the one set of the diamond piezoresistors to which the stress is applied has a thickness greater than a thickness of the other set of the diamond piezoresistors.

The twenty-first force detection device according to the thirteenth force detection device further includes a pair of output electrodes opposed to each other and disposed orthogonal to the pair of input electrodes. In the twenty-first force detection device, the diamond piezoresistor is formed on the (110) plane or a crystal plane equivalent thereto of the diamond substrate; the pair of input electrodes opposed to each other is disposed at an angle in a range of −15° to +15° relative to a direction displaced by 45° from the [110] direction or a crystal direction equivalent thereto; and the plane of application of the stress to the diamond piezoresistor is the (110) plane or a crystal plane equivalent thereto.

The first force transducer device includes: the force detection device according to any one of the thirteenth to twenty-first force detection devices; a buffer block bonded to the plane in which the stress is applied to the diamond piezoresistor; and a pressure-receiving substrate bonded to a plane of the buffer block opposite to the plane to which the diamond piezoresistor is bonded, the pressure-receiving substrate being configured to apply compressive force to the buffer block. In the first force transducer device, the buffer block has a coefficient of thermal expansion smaller than a coefficient of thermal expansion of the pressure-receiving substrate.

The second force transducer device includes: the force detection device according to any one of the thirteenth to twenty-first force detection devices in which the diamond substrate is a single-crystal diamond pressure-receiving substrate; and a buffer block bonded to the plane in which the stress is applied to the diamond piezoresistor. In the second force transducer device, the diamond piezoresistor receives compressive force from the buffer block when compressive force is applied from a rear surface of the single-crystal diamond pressure-receiving substrate.

In the twenty-second force detection device according to any one of the first to twenty-first force detection devices, the diamond piezoresistor includes a single-crystal diamond or a hetero-epitaxial diamond.

In the twenty-third force detection device according to any one of the first to sixth force detection devices, the diamond piezoresistor includes a diamond laminated body; and the diamond laminated body includes a high-concentration boron-doped epitaxial diamond, a low-concentration boron-doped epitaxial diamond, and a high-concentration boron-doped epitaxial diamond that are laminated in this order in a planar direction.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A force detection device comprising a diamond piezoresistor including a highly orientated diamond into which boron is introduced as an impurity,
    wherein an absolute value of a piezoresistance coefficient of the diamond piezoresistor is greater than an absolute value of a piezoresistance coefficient $\pi 11$ or $\pi 12$ in a case in which a major axis is in a <100> direction.

2. The force detection device according to claim 1, further comprising:
    a diamond substrate; and
    a pair of input electrodes opposed to each other on the diamond piezoresistor,
    wherein:
    the diamond piezoresistor is formed on a (100) plane, a (110) plane, a (111) plane, or a crystal plane equivalent thereto of the diamond substrate; and
    the diamond piezoresistor is subjected to a stress applied in a direction that is aligned with or perpendicular to the pair of input electrodes or is a shearing direction with respect to the pair of input electrodes.

3. The force detection device according to claim 2, wherein:
    the pair of input electrodes is a pair of common input/output electrodes opposed to each other at the ends of the diamond piezoresistor; and
    the direction of application of the stress to the diamond piezoresistor is aligned with or perpendicular to the pair of common input/output electrodes.

4. The force detection device according to claim 2, further comprising a pair of output electrodes opposed to each other and disposed orthogonal to the pair of input electrodes,
    wherein the direction of application of the stress to the diamond piezoresistor is a shearing direction with respect to the pair of input electrodes.

5. The force detection device according to claim 1, further comprising:
    a diamond substrate; and
    a pair of input electrodes opposed to each other on the diamond piezoresistor, wherein:
the diamond piezoresistor is formed on the (110) plane, the (111) plane, or a crystal plane equivalent thereto of the diamond substrate; and
the diamond piezoresistor is subjected to a stress applied in a plane which is the (110) plane, the (111) plane, or a crystal plane equivalent thereto.

6. The force detection device according to claim 5, wherein the pair of input electrodes is a pair of common input/output electrodes opposed to each other at the ends of the diamond piezoresistor.

7. A force transducer device comprising:
the force detection device according to claim 5;
a buffer block bonded to the plane in which the stress is applied to the diamond piezoresistor; and
a pressure-receiving substrate bonded to a plane of the buffer block opposite to the plane to which the diamond piezoresistor is bonded, the pressure-receiving substrate being configured to apply compressive force to the buffer block,
wherein the buffer block has a coefficient of thermal expansion smaller than a coefficient of thermal expansion of the pressure-receiving substrate.

8. A force transducer device comprising:
the force detection device according to claim 5 in which the diamond substrate is a single-crystal diamond pressure-receiving substrate; and
a buffer block bonded to the plane in which the stress is applied to the diamond piezoresistor,
wherein the diamond piezoresistor receives compressive force from the buffer block when compressive force is applied from a rear surface of the single-crystal diamond pressure-receiving substrate.

9. The force detection device according to claim 1, wherein the diamond piezoresistor includes a single-crystal diamond or a hetero-epitaxial diamond.

10. The force detection device according to claim 1, wherein:
the diamond piezoresistor includes a diamond laminated body; and
the diamond laminated body includes a high-concentration boron-doped epitaxial diamond, a low-concentration boron-doped epitaxial diamond, and a high-concentration boron-doped epitaxial diamond that are laminated in this order in a planar direction.

* * * * *